US012796445B2

(12) United States Patent
Chiang et al.

(10) Patent No.: US 12,796,445 B2
(45) Date of Patent: Nov. 10, 2026

(54) BOND STRUCTURE

(71) Applicant: Advanced Semiconductor Engineering, Inc., Kaohsiung (TW)

(72) Inventors: Chun-Wei Chiang, Kaohsiung (TW); Yung-Sheng Lin, Kaohsiung (TW); I-Ting Lin, Kaohsiung (TW); Ping-Hung Hsieh, Kaohsiung (TW); Chih-Yuan Hsu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 467 days.

(21) Appl. No.: 18/227,896

(22) Filed: Jul. 28, 2023

(65) Prior Publication Data

US 2025/0038106 A1 Jan. 30, 2025

(51) Int. Cl.

*H10W 20/41* (2026.01)
*H10W 20/00* (2026.01)
*H10W 20/40* (2026.01)
*H10W 20/42* (2026.01)
*H10W 72/00* (2026.01)
*H10W 72/50* (2026.01)
*H10W 72/90* (2026.01)
*H10W 80/00* (2026.01)
*H10W 90/00* (2026.01)

(52) U.S. Cl.

CPC ....... *H10W 20/435* (2026.01); *H10W 20/042* (2026.01); *H10W 20/098* (2026.01); *H10W 20/42* (2026.01); *H10W 72/9415* (2026.01); *H10W 90/701* (2026.01); *H10W 20/40* (2026.01); *H10W 72/01935* (2026.01); *H10W 72/50* (2026.01); *H10W 72/90* (2026.01); *H10W 72/923* (2026.01); *H10W 72/934* (2026.01); *H10W 80/732* (2026.01); *H10W 90/792* (2026.01)

(58) Field of Classification Search

CPC . H10W 20/042; H10W 72/50; H10W 72/923; H10W 72/942; H10W 72/9415; H10W 20/42; H10W 90/00; H10W 72/244; H10W 90/722; H10W 20/435; H10W 20/098; H10W 90/701; H10W 72/224; H10W 72/242; H10W 72/234; H10W 72/072; H10W 20/031; H10W 20/40; H10W 72/01935; H10W 72/90; H10W 72/934; H10W 80/732; H10W 90/792; H10W 72/01955; H10W 90/794; H10W 20/20; H10W 20/484; H01L 23/49811; H01L 21/02603; H05K 2201/026

See application file for complete search history.

(56) References Cited

U.S. PATENT DOCUMENTS

| | | | | |
|---|---|---|---|---|
| 11,195,811 | B2 | 12/2021 | Summerfelt et al. | |
| 2017/0162536 | A1* | 6/2017 | Arvin .................. | H10W 20/031 |
| 2024/0063159 | A1* | 2/2024 | Hsu ....................... | H10W 70/65 |

* cited by examiner

*Primary Examiner* — Steven H Loke
*Assistant Examiner* — Fernando Jose Ramos-Diaz
(74) *Attorney, Agent, or Firm* — Foley & Lardner LLP

(57) ABSTRACT

A bond structure is provided. The bond structure includes a seed layer and a conductive structure. The conductive structure includes a via portion over the seed layer and a plurality of wires protruding from the via portion.

6 Claims, 29 Drawing Sheets

BOND STRUCTURE

BACKGROUND

1. Technical Field

The present disclosure relates generally to a bond structure.

2. Description of the Related Art

Devices or semiconductor wafers may be bonded to each other through various hybrid bonding techniques. Currently, the devices and/or the semiconductor wafers are bonded after chemical mechanical polishing (CMP) processes are performed on the devices and/or the semiconductor wafers. The CMP processes may cause the bonding surfaces on the devices and/or the semiconductor wafers to be uneven, resulting in decreased bonding strength and thus deteriorated device reliability.

SUMMARY

In one or more arrangements, a bond structure includes a seed layer and a conductive structure. The conductive structure includes a via portion over the seed layer and a plurality of wires protruding from the via portion.

In one or more arrangements, a bond structure includes a conductive structure and a seed layer structure. The conductive structure includes a conductive via and a plurality of wires extending from the conductive via. The seed layer structure is on a lateral surface of the conductive via and includes a first material different from a second material of the wires.

In one or more arrangements, a structure includes a first conductive structure, a second conductive structure, and a first dielectric layer. The first conductive structure includes a first via portion and a plurality of first wires extending from the first via portion. The second conductive structure is over the first conductive structure and electrically connected to the first conductive structure via the first wires. The first dielectric layer laterally covers the first wires and includes a first portion contacting a portion of a lateral surface of one of the first wires.

BRIEF DESCRIPTION OF THE DRAWINGS

Aspects of the present disclosure are better understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements.

DETAILED DESCRIPTION

Figure 1A:
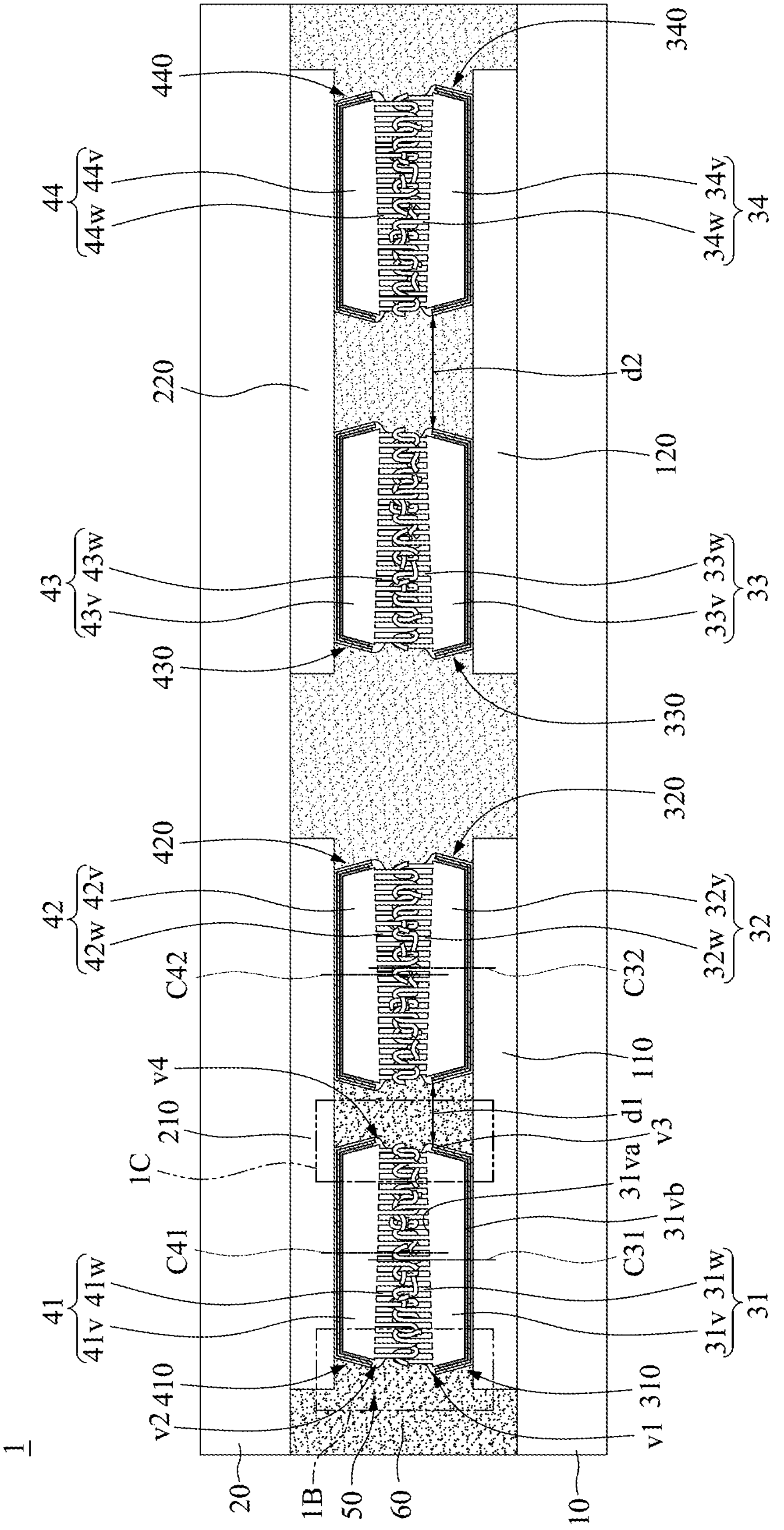
FIG. 1A is a cross-section of a package structure in accordance with some arrangements of the present disclosure.
Figure 1C:
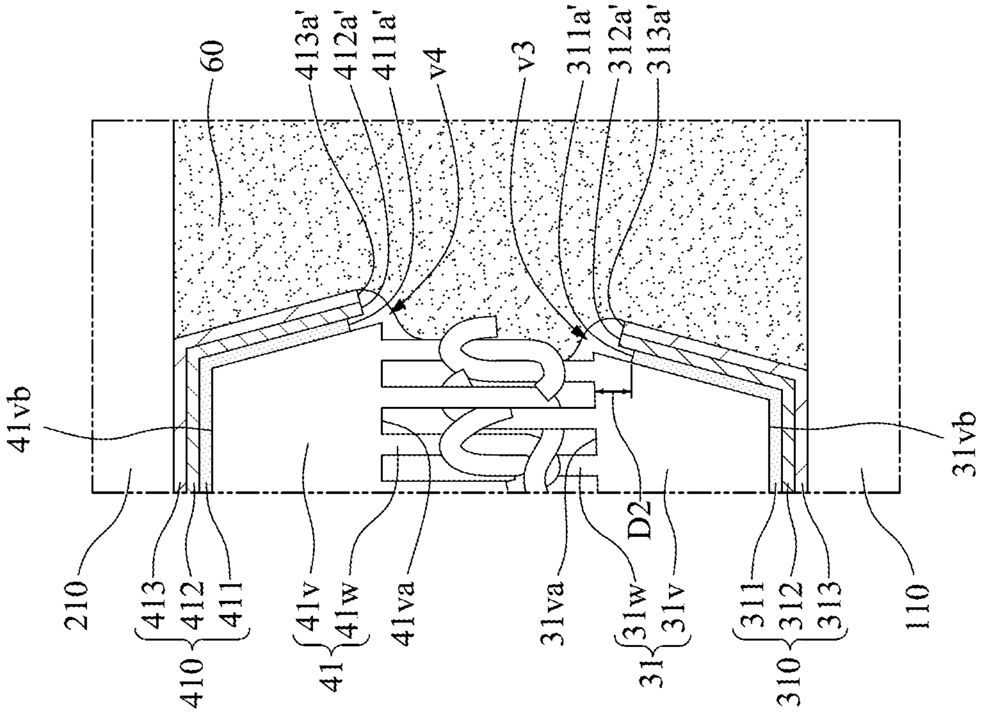
FIG. 1C is a cross-section of a portion of a package structure in accordance with some arrangements of the present disclosure.
Figure 1B:
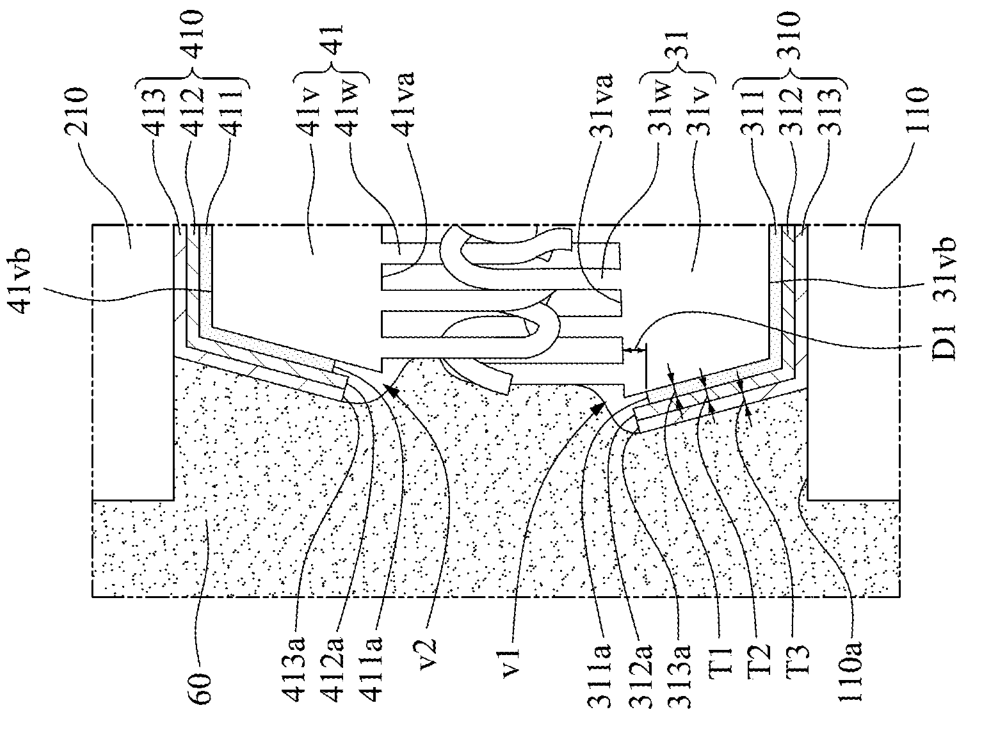
FIG. 1B is a cross-section of a portion of a package structure in accordance with some arrangements of the present disclosure.

FIG. 1A is a cross-section of a package structure 1 in accordance with some arrangements of the present disclosure. FIG. 1B is a cross-section of a portion of a package structure 1 in accordance with some arrangements of the present disclosure. FIG. 1C is a cross-section of a portion of a package structure 1 in accordance with some arrangements of the present disclosure. In some arrangements, FIG. 1B shows a portion 1B of the package structure 1 illustrated in FIG. 1A, and FIG. 1C shows a portion 1C of the package structure 1 illustrated in FIG. 1B. The package structure 1 may include substrates 10 and 20 and a hybrid bond structure 50.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, which may include such as a plurality of conductive traces and/or a plurality of conductive vias. The interconnection structure may include a redistribution layer (RDL) and/or a grounding element. In some arrangements, the substrate 10 may include an organic substrate or a leadframe. In some arrangements, the substrate 10 includes a ceramic material or a metal plate. In some arrangements, the substrate 10 may include a two-layer substrate which includes a core layer and a conductive material and/or structure disposed on an upper surface and a bottom surface of the substrate 10. The substrate 10 may include a semiconductor wafer or an electronic component. The electronic component may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The substrate 10 may be referred to as a wiring structure, a circuit structure, a conductive structure, or a conductive carrier. In some arrangements, the substrate 10 includes one or more conductive elements, surfaces, contacts, or pads (e.g., conductive layers 110 and 120).

The substrate 20 may be disposed over the substrate 10. The substrate 20 may be connected or electrically connected to the substrate 10. The substrate 20 may include, for example, a printed circuit board, such as a paper-based copper foil laminate, a composite copper foil laminate, or a polymer-impregnated glass-fiber-based copper foil laminate. The substrate 20 may include an interconnection structure, which may include a plurality of conductive traces and/or a plurality of conductive vias. The interconnection structure may include an RDL and/or a grounding element. In some arrangements, the substrate 20 may include such as an organic substrate or a leadframe. In some arrangements, the substrate 20 includes a ceramic material or a metal plate. In some arrangements, the substrate 20 may include a two-layer substrate which includes a core layer and a conductive material and/or structure disposed on an upper surface and a bottom surface of the substrate 20. The substrate 20 may include a semiconductor wafer or an electronic component. The electronic component may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The substrate 10 may be referred to as a wiring structure, a circuit structure, a conductive structure, or a conductive carrier. In some arrangements, the substrate 20 includes one or more conductive elements, surfaces, contacts, or pads (e.g., conductive layers 210 and 220).

The hybrid bond structure 50 may include one or more conductive structures (e.g., conductive structures 31, 32, 33, 34, 41, 42, 43, and 44), a dielectric layer 60 around, surrounding, or between the one or more conductive structures, and one or more seed layer structures (e.g., seed layer structures 310, 320, 330, 340, 410, 420, 430, and 440). The seed layer structures 310, 320, 330, 340, 410, 420, 430, and 440 may be referred to as "seed layers." In some arrangements, the substrate 20 is connected or electrically connected to the substrate 10 via the hybrid bond structure 50. The conductive structure may include a conductive material such as a metal or metal alloy, for example, gold (Au), silver (Ag), aluminum (Al), copper (Cu), or an alloy thereof. The seed layer structure may include, for example, titanium (Ti), Cu, nickel (Ni), another metal, or an alloy (such as a titanium-tungsten alloy (TiW)).

In some arrangements, the conductive structure 31 is over the conductive layer 110. The conductive structure 31 may be referred to as a hybrid bond pad. The conductive structure 31 may be referred to as a pre-bonding layer. That is, the conductive structure 31 may be configured as a pre-bonding layer in a hybrid bonding operation. In some examples, a "pre-bonding layer" used herein refers to the layers or pads of a hybrid bond structure that bond or connect to each other first, before being bond or connected to other elements. For example, the conductive structure 31 (or the pre-bonding layer) may be first bonded to a corresponding conductive structure or conductive pad (e.g., conductive structure 41), then followed by bonding dielectric materials or layers around the bonded conductive structures or pads.

In some arrangements, the conductive structure 31 includes a via portion 31*v* (also referred to as "a conductive via") and a wire bundle portion 31*w* (also referred to as "a wire bundle structure"). The conductive structure 31 may be over the seed layer structure 310 (or the seed layer). In some arrangements, the wire bundle portion 31*w* extends from the via portion 31*v*. In some arrangements, there is no seed layer between the via portion 31*v* and the wire bundle portion 31*w*. In some arrangements, no interface is formed between the via portion 31*v* and the wire bundle portion 31*w*. The term "interface" used hereinafter indicates an interface formed between different materials or portions formed from different operations and can be observed through a microscope photo, such as a SEM photo. In some arrangements, the via portion 31*v* is integrally formed with the wire bundle portion 31*w*. In some arrangements, the via portion 31*v* and the wire bundle portion 31*w* are integrally formed as a monolithic bonding pad (i.e., the conductive structure 31). In some arrangements, the conductive structure 31 (or the combination of the via portion 31*v* and the wire bundle portion 31*w*) is a monolithic or single-piece hybrid bond pad. In some arrangements, the wire bundle portion 31*w* includes a plurality of wires (e.g., nanowires). The wires may be over the via portion 31*v* and protruding from the via portion 31*v*. In some arrangements, a portion of the wires (e.g., the wires of the wire bundle portion 31*w*) close to or in a region over a central area of the via portion 31*v* may be spaced apart from the dielectric layer 60 by a distance that is longer than a distance by which another portion of the wires (e.g., other wires of the wire bundle portion 31*w*) away from or in a region different from a central area of the via portion 31*v* may be spaced apart from the dielectric layer 60. The wires of the wire bundle portion 31*w* may extend from the via portion 31*v*. The dielectric layer 60 may laterally encapsulate or surround the via portion 31*v*. In some arrangements, the dielectric layer 60 directly contacts a lateral surface of the wires of the wire bundle portion 31*w*. In some arrangements, the dielectric layer 60 directly contacts a portion of a lateral surface of the wires of the wire bundle portion 31*w*. In some arrangements, the wire bundle portion 31*w* includes a plurality of wires in an arrangement, including being tangled with each other or another suitable arrangement such as being arranged next to each other. In some arrangements, the wire bundle portion 31*w* is provided or configured as a pre-bonding layer. In some arrangements, the via portion 31*v* has a surface 31*va* (or a top surface) connected to the wire bundle portion 31*w* and a surface 31*vb* (or a bottom surface) opposite to the surface 31*va*. the surface 31*va* is inclined with respect to the surface 31*vb*. For example, the distances between the surfaces 31*va* and 31*vb* measured along vertical axes that are perpendicular to a reference surface changes along the surfaces 31*va* and 31*vb*, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110. In some arrangements, the via portion 31*v* tapers in a horizontal direction or axis that is parallel to a reference surface such as the surface 31*vb*, a surface 110*a* of the conductive layer 110 that contacts the seed layer structure 310, or a surface of the seed layer structure 310 that contacts the conductive layer 110.

In some arrangements, the seed layer structure 310 includes one or more seed layers (e.g., seed layers 311, 312, and 313). The seed layers 311, 312, and 313 may have end portion (e.g., top end portions) at different elevations relative to a reference surface such as the surface 31*va*, the surface 31*vb*, a surface 110*a* of the conductive layer 110 that contacts the seed layer structure 310, or a surface of the seed layer structure 310 that contacts the conductive layer 110. In some arrangements, the elevations of the end portions of the seed layers 311, 312, and 313 relative to the reference surface gradually decreases along a direction toward the via portion 31*v*. In some arrangements, the seed layer structure 310 is between the via portion 31*v* and the conductive layer 110. In some arrangements, the seed layer structure 310 contacts the via portion 31*v* and extends over lateral surfaces of the via portion 31*v*. The seed layer structure 310 may be on a lateral surface of the via portion 31*v* and spaced apart from the wires (e.g., the wires of the wire bundle portion 31*w*) by the via portion 31*v*. The seed layer structure 310 may cover or surround a lateral side of the via portion 31*v*. The seed layer structure 310 may laterally cover or surround the via portion 31*v*. At least an end portion of the seed layer structure 310 may be outside of a vertical projection of the wires (e.g., the wires of the wire bundle portion 31*w*), where the vertical projection is along axes perpendicular to a reference surface, the reference surface is a surface such as the surface 31*va*, surface 31*vb*, a surface 110*a* of the conductive layer 110 that contacts the seed layer structure 310, or a surface of the seed layer structure 310 that contacts the conductive layer 110. In some arrangements, at least one of the wires of the wire bundle portion 31*w* includes an end portion connected to the via portion 31*v* and at an elevation with respect to a reference surface that is higher than an elevation of the end portion (or the top end portion) of the seed layer structure 310 with respect to the reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110. In some arrangements, an elevation of an end portion of the seed layer structure 310 with respect to the reference surface is lower than an elevation of the top surface 31*va* of the via portion 31*v* with respect to the reference surface. The dielectric layer 60 may extend toward a region or a space over a portion of the seed layer structure 310. A portion of the dielectric layer 60 may vertically overlap a portion of the seed layer structure 310 along vertical axes that are perpendicular to a reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110.

In some arrangements, a portion of the seed layer 311 (also referred to as "an auxiliary seed layer") is between the dielectric layer 60 and the via portion 31*v*. In some arrangements, the seed layer 311 is around or surrounds the via portion 31*v*. In some arrangements, the seed layer 311 and the wire bundle portion 31*w* include different materials. In some arrangements, the seed layer 311 and the via portion 31*v* include different materials. For example, the seed layer 311 may include Ti, and the via portion 31*v* may include Cu. In some arrangements, the seed layer 311 has a relatively high etching selectivity with respect to the via portion 31*v*. The term "high etching selectivity" used hereinafter indicates that two materials are etched away at substantially different rates. The term "etching selectivity" used hereinafter indicates the ratio of an etching rate of a first material with respect to an etching rate of a second material. In some arrangements, an etching rate of the seed layer 311 and an etching rate of the via portion 31*v* with respect to a same etching solution are substantially different. In some arrangements, the etching selectivity of the seed layer 311 to the via portion 31*v* is greater than about 2, 3, 5, 8, or 10. In some arrangements, the seed layer 311 has a relatively high etching selectivity with respect to the wire bundle portion 31*w*. In some arrangements, the etching selectivity of the seed layer 311 to the wire bundle portion 31*w* is greater than about 2, 3, 5, 8, or 10. In some arrangements, the seed layer 311 (e.g., a surface thereof) contacts the via portion 31*v*. In some arrangements, the seed layer 311 (or the auxiliary seed layer) is between the conductive layer 110 and the via portion 31*v* and configured to define a predetermined pattern of the wire bundle portion 31*w*. For example, the predetermined pattern of the wire bundle portion 31*w* may be defined due to that the seed layer 311 and the via portion 31*v* include different materials, the detailed reasons are described hereinafter. The seed layer 311 may be or include Ti.

In some arrangements, the seed layer 311 includes two end portions (e.g., a first end portion and a second end portion) on opposite sides of the via portion 31*v*, and one or both of the top surfaces (also referred to as "end surfaces", e.g., surfaces 311*a* and 311*a*') of the end portions may have a lower elevation with respect to a reference surface than a top surface 31*va* of the via portion 31*v* with respect to the reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110. In some arrangements, the top surfaces 311*a* and 311*a*' of the end portions of the seed layer 311 are at different elevations relative to the reference surface. In some arrangements, a first end (or the first end portion) of the seed layer 311 is recessed from the top surface 31*va* of the via portion 31*v* and toward a reference surface by a distance D1 along direction or axis that is perpendicular to the reference surface (e.g., the surface 31*vb*, a surface 110*a* of the conductive layer 110 that contacts the seed layer structure 310, or a surface of the seed layer structure 310 that contacts the conductive layer 110). A second end (or the second end portion) of the seed layer 311 is recessed from the top surface 31*va* of the via portion 31*v* and toward the reference surface by a distance D2 along direction or axis that is perpendicular to the reference surface (e.g., the surface 31*vb*, a surface 110*a* of the conductive layer 110 that contacts the seed layer structure 310, or a surface of the seed layer structure 310 that contacts the conductive layer 110). D2 is different from the distance D1. In some arrangements, a thickness T1 of the seed layer 311 may be equal to or less than about 1000 Å.

In some arrangements, a portion of the seed layer 312 is between the conductive layer 110 and the seed layer 311. In some arrangements, the seed layer 311 and the seed layer 312 include different materials. In some arrangements, the seed layer 312 has a relatively high etching selectivity with respect to the seed layer 311. In some arrangements, the etching selectivity of the seed layer 312 to the seed layer 311 is greater than about 2, 3, 5, 8, or 10. In some arrangements, a thickness T2 of the seed layer 312 may be equal to or greater than about 1000 Å, e.g., about 2000 Å. In some arrangements, the thickness T1 of the end portion of the seed layer 311 is substantially equal to or less than the thickness T2 of the seed layer 312. In some arrangements, the seed layer 312 includes two end portions (e.g., a first end portion and a second end portion) on opposite sides of the via portion 31*v*, and one or both of the top surfaces (e.g., surfaces 312*a* and 312*a*') of the end portions may have a lower elevation with respect to a reference surface than the top surface 31*va* of the via portion 31*v* with respect to the reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110. In some arrangements the top surfaces 312*a* and 312*a*' of the end portions of the seed layer 312 are at different elevations relative to the reference surface. In some arrangements, a first end (or the first end portion) of the seed layer 312 and a second end (or the second end portion) of the seed layer 312 are respectively recessed from the top surface 31*va* of the via portion 31*v* and toward a reference surface by the same or different distances along direction or axis that is perpendicular to the reference surface (e.g., the surface 31*vb*, a surface 110*a* of the conductive layer 110 that contacts the seed layer structure 310, or a surface of the seed layer structure 310 that contacts the conductive layer 110). In some arrangements, the surface 311*a* is recessed from the surface 312*a* toward the reference surface, and the surface 311*a*' is recessed from the surface 312*a*' and toward the reference surface. The seed layer 312 may be or include Cu. In some arrangements, an end portion of the seed layer 311 is closer to the via portion 31*v* than an end portion of the seed layer 312, and an elevation of the end portion of the seed layer 311 with respect to the reference surface is lower than an elevation of the end portion of the seed layer 312 with respect to the reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110.

In some arrangements, a portion the seed layer 313 is between the conductive layer 110 and the seed layer 312. In some arrangements, the seed layer 312 and the seed layer 313 include different materials. In some arrangements, the seed layer 313 has a relatively high etching selectivity with respect to the seed layer 312. In some arrangements, the etching selectivity of the seed layer 313 to the seed layer 312 is greater than about 2, 3, 5, 8, or 10. In some arrangements, a thickness T3 of the seed layer 313 may be equal to or less than about 1000 Å. In some arrangements, the thickness T3 of the seed layer 313 is substantially equal to or less than the thickness T2 of the seed layer 312. In some arrangements, the seed layer 313 includes two end portions (e.g., a first end portion and a second end portion) on opposite sides of the via portion 31*v*, and one or both of the top surfaces (e.g., surfaces 313*a* and 313*a*') of the end portions may have a lower elevation with respect to a reference surface than the top surface 31*va* of the via portion 31*v* with respect to the reference surface, where the reference surface is a surface such as the surface 31*va*, the surface 31*vb*, a surface 110*a* of the conductive layer 110 that contacts the seed layer structure 310, or a surface of the seed layer structure 310 that contacts the conductive layer 110. In some arrangements the top surfaces 313*a* and 313*a*' of the end portions of the seed layer 313 are at different elevations relative to the reference surface. In some arrangements, a first end (or the first end portion) of the seed layer 313 and a second end (or the second end portion) of the seed layer 313 are respectively recessed from the top surface 31*va* of the via portion 31*v* and toward a reference surface by the same or different distances along direction or axis that is perpendicular to the reference surface (e.g., the surface 31*vb*, a surface 110*a* of the conductive layer 110 that contacts the seed layer structure 310, or a surface of the seed layer structure 310 that contacts the conductive layer 110). In some arrangements, the surface 311*a* is recessed from the surface 313*a* and toward the reference surface, and the surface 311*a*' is recessed from the surface 313*a*' and toward the reference surface. In some arrangements, the surface 312*a* is substantially aligned or coplanar with the surface 313*a*, and the surface 312*a*' is substantially aligned or coplanar with the surface 313*a*'. The seed layer 313 may be or include Ti. The seed layer structure 310 may include a material (also referred to as "a first material") different from a material (also referred to as "a second material") of the wires (e.g., the wires of the wire bundle portion 31*w*). For example, the seed layers 311 and 311 of the seed layer structure 310 include Ti, and the wires include Cu.

In some arrangements, the conductive structure 32 is adjacent to the conductive structure 31. In some arrangements, the conductive structure 32 is over the conductive layer 110. The conductive structure 32 may be referred to as a "hybrid bond pad." The conductive structure 32 may be referred to as a "pre-bonding layer." That is, the conductive structure 32 may be configured as a pre-bonding layer in a hybrid bonding operation. For example, the conductive structure 32 (or the pre-bonding layer) may be first bonded to a corresponding conductive structure or conductive pad (e.g., conductive structure 42), then followed by bonding dielectric materials or layers around the bonded conductive structures or pads.

In some arrangements, the conductive structure 32 includes a via portion 32*v* (also referred to as "a conductive via") and a wire bundle portion 32*w* (also referred to as "a wire bundle structure"). In some arrangements, the wire bundle portion 32*w* extends from the via portion 32*v*. In some arrangements, there is no seed layer between the via portion 32*v* and the wire bundle portion 32*w*. In some arrangements, no interface is formed between the via portion 32*v* and the wire bundle portion 32*w*. In some arrangements, the via portion 32*v* is integrally formed with the wire bundle portion 32*w*. In some arrangements, the via portion 32*v* and the wire bundle portion 32*w* are integrally formed as a monolithic bonding pad (e.g., the conductive structure 32). In some arrangements, the conductive structure 32 (or the combination of the via portion 32*v* and the wire bundle portion 32*w*) is a monolithic or single-piece hybrid bond pad. In some arrangements, the wire bundle portion 32*w* includes a plurality of wires (e.g., nanowires). In some arrangements, the wire bundle portion 32*w* includes a plurality of wires in an arrangement, including being tangled with each other or another suitable arrangement such as being arranged next to each other. In some arrangements, the wire bundle portion 32*w* is configured as a pre-bonding layer. In some arrangements, the via portion 32*v* has a top surface connected to the wire bundle portion 32*w* and a bottom surface opposite to the top surface. The top surface is inclined with respect to the bottom surface of the via portion 32*v*. For example, the distances between the top surface and the bottom surface of the via portion 32*v* measured along vertical axes that are perpendicular to a reference surface changes along the top and bottom surfaces of the via portion 32*v*, where the reference surface is a surface such as the top and bottom surfaces of the via portion 32*v*, a surface 110*a* of the conductive layer 110 that contacts the seed layer structure 320, or a surface of the seed layer structure 320 that contacts the conductive layer 110. In some arrangements, the via portion 32*v* tapers in a horizontal direction or axis that is parallel to a reference surface such as the top and bottom surfaces of the via portion 32*v*, a surface 110*a* of the conductive layer 110 that contacts the seed layer structure 320, or a surface of the seed layer structure 320 that contacts the conductive layer 110. In some arrangements, as shown, the via portion 31*v* and the via portion 32*v* taper toward opposite directions.

In some arrangements, the seed layer structure 320 includes one or more seed layers. In some arrangements, the seed layers of the seed layer structure 320 have structures similar to those of the seed layer structure 310 (e.g., the seed layers 311, 312, and 313), and the description thereof is omitted hereinafter. In some arrangements, the seed layer structure 320 is between the via portion 32$v$ and the conductive layer 110. In some arrangements, the seed layer structure 320 contacts the via portion 32$v$ and extends over lateral surfaces of the via portion 32$v$.

In some arrangements, the conductive structure 41 is under the conductive layer 210. In some arrangements, the conductive structure 41 is over the conductive structure 31. In some arrangements, the conductive structure 41 is connected to or electrically connected to the conductive structure 31. The conductive structure 41 may be electrically connected to the conductive structure 31 via the wires (e.g., the wires of the wire bundle portion 31$w$). The conductive structure 41 may be referred to as a hybrid bond pad. The conductive structure 41 may be referred to as a pre-bonding layer. That is, the conductive structure 41 may be configured as a pre-bonding layer in a hybrid bonding operation. For example, the conductive structure 41 (or the pre-bonding layer) may be first bonded to a corresponding conductive structure or conductive pad (e.g., conductive structure 31), then followed by bonding dielectric materials or layers around the bonded conductive structures or pads.

In some arrangements, the conductive structure 41 includes a via portion 41$v$ (also referred to as "a conductive via") and a wire bundle portion 41$w$ (also referred to as "a wire bundle structure"). In some arrangements, the wire bundle portion 41$w$ extends from the via portion 41$v$. In some arrangements, there is no seed layer between the via portion 41$v$ and the wire bundle portion 41$w$. In some arrangements, no interface is formed between the via portion 41$v$ and the wire bundle portion 41$w$. In some arrangements, the via portion 41$v$ is integrally formed with the wire bundle portion 41$w$. In some arrangements, the via portion 41$v$ and the wire bundle portion 41$w$ are integrally formed as a monolithic bonding pad (i.e., the conductive structure 41). In some arrangements, the conductive structure 41 (or the combination of the via portion 41$v$ and the wire bundle portion 41$w$) is a monolithic or single-piece hybrid bond pad. In some arrangements, the wire bundle portion 41$w$ includes a plurality of wires (e.g., nanowires). In some arrangements, a portion of the dielectric layer 60 vertically overlaps the wires of the wire bundle portion 31$w$ and/or the wires of the wire bundle portion 41$w$ along vertical axes that are perpendicular to a reference surface, where the reference surface is a surface such as the surface 31$va$, the surface 31$vb$, a surface 110$a$ of the conductive layer 110 that contacts the seed layer structure 310, a surface of the seed layer structure 310 that contacts the conductive layer 110, the surface 41$va$, the surface 41$vb$, a surface of the conductive layer 210 that contacts the seed layer structure 410, or a surface of the seed layer structure 410 that contacts the conductive layer 210. In some arrangements, the wire bundle portion 41$w$ includes a plurality of wires in an arrangement, including being tangled with each other or another suitable arrangement such as being arranged next to each other. In some arrangements, the wire bundle portion 41$w$ is configured as a pre-bonding layer. In some arrangements, the via portion 41$v$ has a surface 41$va$ (or a bottom surface) connected to the wire bundle portion 41$w$ and a surface 41$vb$ (or a top surface) opposite to the surface 41$va$. The surface 41$va$ is inclined with respect to the surface 41$vb$. For example, the distances between the surfaces 41$vb$ and 41$va$ of the via portion 41$v$ measured along vertical axes that are perpendicular to a reference surface changes along the surfaces 41$vb$ and 41$va$, where the reference surface is a surface such as the surface 41$va$, the surface 41$vb$, a surface of the conductive layer 210 that contacts the seed layer structure 410, or a surface of the seed layer structure 410 that contacts the conductive layer 210. In some arrangements, the via portion 41$v$ tapers in a horizontal direction or axis that is parallel to a reference surface such as the surface 41$va$, the surface 41$vb$, a surface of the conductive layer 210 that contacts the seed layer structure 410, or a surface of the seed layer structure 410 that contacts the conductive layer 210. In some arrangements, the wire bundle portion 41$w$ is connected or coupled to the wire bundle portion 31$w$. In some arrangements, wires of the wire bundle portion 41$w$ tangled with wires of the wire bundle portion 31$w$.

In some arrangements, the seed layer structure 410 includes one or more seed layers (e.g., seed layers 411, 412, and 413). In some arrangements, the seed layer structure 410 is between the via portion 41$v$ and the conductive layer 210. In some arrangements, the seed layer structure 410 contacts the via portion 41$v$ and extends over lateral surfaces of the via portion 41$v$.

In some arrangements, a portion of the seed layer 411 (also referred to as "an auxiliary seed layer") is between the dielectric layer 60 and the via portion 41$v$. In some arrangements, the seed layer 411 is around or surrounds the via portion 41$v$. In some arrangements, the seed layer 411 and the wire bundle portion 41$w$ include different materials. In some arrangements, the seed layer 411 and the via portion 41$v$ include different materials. In some arrangements, the seed layer 411 has a relatively high etching selectivity with respect to the via portion 41$v$. In some arrangements, the etching selectivity of the seed layer 411 to the via portion 41$v$ is greater than about 2, 3, 5, 8, or 10. In some arrangements, the seed layer 411 has a relatively high etching selectivity with respect to the wire bundle portion 41$w$. In some arrangements, the etching selectivity of the seed layer 411 to the wire bundle portion 41$w$ is greater than about 2, 3, 5, 8, or 10. In some arrangements, the seed layer 411 (e.g., a surface thereof) contacts the via portion 41$v$. In some arrangements, the seed layer 411 (or the auxiliary seed layer) is between the conductive layer 210 and the via portion 41$v$ and configured to define a predetermined pattern of the wire bundle portion 41$w$, similar to described relative to the seed layer 311.

In some arrangements, the seed layer 411 includes two end portions (e.g., a first end portion and a second end portion) on opposite sides of the via portion 41$v$, and one or both of the end surfaces (e.g., surfaces 411$a$ and 411$a'$) of the end portions may be recessed from the surface 41$va$ (or the bottom surface) of the via portion 41$v$ and toward a reference surface along direction or axis that is perpendicular to the reference surface (e.g., the surface 41$vb$, a surface of the conductive layer 210 that contacts the seed layer structure 410, or a surface of the seed layer structure 410 that contacts the conductive layer 210). In some arrangements, the surfaces 411$a$ and 411$a'$ of the end portions of the seed layer 411 are at different elevations relative to the reference surface. In some arrangements, a first end (or the first end portion) of the seed layer 411 and a second end (or the second end portion) of the seed layer 411 are recessed from the surface 41$va$ of the via portion 41$v$ and toward a reference surface by the same or different distances along direction or axis that is perpendicular to the reference surface (e.g., the surface 41$vb$, a surface of the conductive layer 210 that contacts the seed layer structure 410, or a surface of the seed layer structure 410 that contacts the conductive layer 210). In some arrangements, a thickness of the seed layer 411 may be equal to or less than about 1000

Å. In some arrangements, a central axis (e.g., an axis C31) of the seed layer 311 is misaligned with a central axis (e.g., an axis C41) of the seed layer 411.

In some arrangements, a portion of the seed layer 412 is between the conductive layer 210 and the seed layer 411. In some arrangements, the seed layer 411 and the seed layer 412 include different materials. In some arrangements, the seed layer 412 has a relatively high etching selectivity with respect to the seed layer 411. In some arrangements, the etching selectivity of the seed layer 412 to the seed layer 411 is greater than about 2, 3, 5, 8, or 10. In some arrangements, a thickness of the seed layer 412 may be equal to or greater than about 1000 Å, e.g., about 2000 Å. In some arrangements, the thickness of the seed layer 411 is substantially equal to or less than the thickness of the seed layer 412. In some arrangements, the seed layer 412 includes two end portions (e.g., a first end portion and a second end portion) on opposite sides of the via portion 41*v*, and one or both of the end surfaces (e.g., surfaces 412*a* and 412*a*') of the end portions may be recessed from the surface 41*va* of the via portion 41*v* and toward a reference surface along direction or axis that is perpendicular to the reference surface (e.g., the surface 41*vb*, a surface of the conductive layer 210 that contacts the seed layer structure 410, or a surface of the seed layer structure 410 that contacts the conductive layer 210). In some arrangements the surfaces 412*a* and 412*a*' of the end portions of the seed layer 412 are at different elevations relative to the reference surface. In some arrangements, a first end (or the first end portion) of the seed layer 412 and a second end (or the second end portion) of the seed layer 412 are recessed from the surface 41*va* of the via portion 41*v* and toward the reference surface by the same or different distances along direction or axis that is perpendicular to the reference surface (e.g., the surface 41*vb*, a surface of the conductive layer 210 that contacts the seed layer structure 410, or a surface of the seed layer structure 410 that contacts the conductive layer 210). In some arrangements, the surface 411*a* is recessed from the surface 412*a* and toward the reference surface, and the surface 411*a*' is recessed from the surface 412*a' and toward the reference surface.*

In some arrangements, the seed layer 413 is between the conductive layer 210 and the seed layer 412. In some arrangements, the seed layer 412 and the seed layer 413 include different materials. In some arrangements, the seed layer 413 has a relatively high etching selectivity with respect to the seed layer 412. In some arrangements, the etching selectivity of the seed layer 413 to the seed layer 412 is greater than about 2, 3, 5, 8, or 10. In some arrangements, a thickness of the seed layer 413 may be equal to or less than about 1000 Å. In some arrangements, the thickness of the seed layer 413 is substantially equal to or less than the thickness of the seed layer 412. In some arrangements, the seed layer 413 includes two end portions (e.g., a first end portion and a second end portion) on opposite sides of the via portion 41*v*, and one or both of the end surfaces (e.g., surfaces 413*a* and 413*a*') of the end portions may be recessed from the surface 41*va* of the via portion 41*v* and toward a reference surface along direction or axis that is perpendicular to the reference surface (e.g., the surface 41*vb*, a surface of the conductive layer 210 that contacts the seed layer structure 410, or a surface of the seed layer structure 410 that contacts the conductive layer 210). In some arrangements the surfaces 413*a* and 413*a*' of the end portions of the seed layer 413 are at different elevations relative to the reference surface. In some arrangements, a first end (or the first end portion) of the seed layer 413 and a second end (or the second end portion) of the seed layer 413 are respectively recessed from the surface 41*va* of the via portion 41*v* and toward a reference surface by the same or different distances along direction or axis that is perpendicular to the reference surface (e.g., the surface 41*vb*, a surface of the conductive layer 210 that contacts the seed layer structure 410, or a surface of the seed layer structure 410 that contacts the conductive layer 210). In some arrangements, the surface 411*a* is recessed from the surface 413*a* toward the reference surface, and the surface 411*a*' is recessed from the surface 413*a*' toward the reference surface. In some arrangements, the surface 412*a* is substantially aligned or coplanar with the surface 413*a*, and the surface 412*a*' is substantially aligned or coplanar with the surface 413*a'*.

In some arrangements, the conductive structure 42 is adjacent to the conductive structure 41. In some arrangements, the conductive structure 42 is over the conductive layer 210. The conductive structure 42 may be referred to as a hybrid bond pad. The conductive structure 42 may be referred to as a pre-bonding layer. That is, the conductive structure 42 may be configured as a pre-bonding layer in a hybrid bonding operation. For example, the conductive structure 42 (or the pre-bonding layer) may be first bonded to a corresponding conductive structure or conductive pad (e.g., conductive structure 32), then followed by bonding dielectric materials or layers around the bonded conductive structures or pads.

In some arrangements, the conductive structure 42 includes a via portion 42*v* (also referred to as "a conductive via") and a wire bundle portion 42*w* (also referred to as "a wire bundle structure"). In some arrangements, the wire bundle portion 42*w* extends from the via portion 42*v*. In some arrangements, there is no seed layer between the via portion 42*v* and the wire bundle portion 42*w*. In some arrangements, no interface is formed between the via portion 42*v* and the wire bundle portion 42*w*. In some arrangements, the via portion 42*v* is integrally formed with the wire bundle portion 42*w*. In some arrangements, the via portion 42*v* and the wire bundle portion 42*w* are integrally formed as a monolithic bonding pad (e.g., the conductive structure 42). In some arrangements, the conductive structure 42 (or the combination of the via portion 42*v* and the wire bundle portion 42*w*) is a monolithic or single-piece hybrid bond pad. In some arrangements, the wire bundle portion 42*w* includes a plurality of wires (e.g., nanowires). In some arrangements, the wire bundle portion 42*w* includes a plurality of wires in an arrangement, including being tangled with each other or another suitable arrangement such as being arranged next to each other. In some arrangements, the wire bundle portion 42*w* is configured as a pre-bonding layer. In some arrangements, the via portion 42*v* has a bottom surface connected to the wire bundle portion 42*w* and a top surface opposite to the bottom surface, and the bottom surface is inclined with respect to the top surface of the via portion 42*v*. For example, the distances between the top surface and the bottom surface of the via portion 42*v* measured along vertical axes that are perpendicular to a reference surface changes along the top and bottom surfaces of the via portion 42*v*, where the reference surface is a surface such as the top and bottom surfaces of the via portion 42*v*, a surface of the conductive layer 210 that contacts the seed layer structure 420, or a surface of the seed layer structure 420 that contacts the conductive layer 210. In some arrangements, the via portion 42*v* tapers in a horizontal direction or axis that is parallel to a reference surface such as the top and bottom surfaces of the via portion 42*v*, a surface of the conductive layer 210 that contacts the seed layer structure 420, or a surface of the seed layer structure 420 that contacts the conductive layer 210. In some arrangements, as shown, the via portion 41*v* and the via portion 42*v* taper toward opposite directions.

In some arrangements, the seed layer structure 420 includes one or more seed layers. In some arrangements, the seed layers of the seed layer structure 420 have structures similar to those of the seed layer structure 410 (e.g., the seed layers 411, 412, and 413), and the description thereof is omitted hereinafter. In some arrangements, the seed layer structure 420 is between the via portion 42*v* and the conductive layer 210. In some arrangements, the seed layer structure 420 contacts the via portion 42*v* and extends over lateral surfaces of the via portion 42*v*. In some arrangements, a central axis (e.g., an axis C32) of the seed layer structure 320 is misaligned with a central axis (e.g., an axis C42) of the seed layer structure 420.

In some arrangements, the conductive structures 33 and 34 have structures similar to those of the conductive structures 31 and 32, the conductive structures 43 and 44 have structures similar to those of the conductive structures 41 and 42, the seed layer structures 330 and 340 have structures similar to those of the seed layer structures 310 and 310, the seed layer structures 430 and 440 have structures similar to those of the seed layer structures 410 and 410, and the descriptions thereof are omitted hereinafter. In some arrangements, a distance d1 between the conductive structure 31 and the conductive structure 32 is different from a distance d2 between the conductive structure 33 and the conductive structure 34. The distance d1 is the shortest distance between two closest points on surface 313*a*' of the seed layer structure 310 and a surface of the seed layer structure 320 similar to the 313*a* of the seed layer structure 310. The distance d2 is the shortest distance between two closest points on a surface of the seed layer structure 330 similar to the surface 313*a*' of the seed layer structure 310 and a surface of the seed layer structure 340 similar to the 313*a* of the seed layer structure 310.

In some arrangements, the dielectric layer 60 is around or surrounds the conductive structures 31, 32, 33, 34, 41, 42, 43, and 44. In some arrangements, the dielectric layer 60 is around or surrounds one or more of the via portions 31*v*, 32*v*, 33*v*, 34*v*, 41*v*, 42*v*, 43*v*, and 44*v*. In some arrangements, the dielectric layer 60 contacts one or more lateral sides of the wire bundle portions 31*w*, 32*w*, 33*w*, 34*w*, 41*w*, 42*w*, 43*w*, and 44*w*. In some arrangements, the dielectric layer 60 does not extend between the wires of a single wire bundle portion. In some arrangements, the dielectric layer 60 does not extend into the spaces between the wires of a single wire bundle portion. In some arrangements, the dielectric layer 60 contacts at least one of the wires of the wire bundle portion 31*w* and at least one of the wires of the wire bundle portion 41*w*. In some arrangements, the dielectric layer 60 includes a dielectric material having a coefficient of thermal expansion (CTE) greater than that of the conductive structure 31. The dielectric layer 60 may include an organic dielectric material having a glass transition temperature (Tg) lower than about 180° C., for example, from about 160° C. to about 170° C. The dielectric layer 60 may include polyimide.

In some arrangements, the dielectric layer 60 contacts a portion of the wire bundle portion 31*w* and defines a void v1 (also referred to as "a space") between the conductive structure 31 and the dielectric layer 60. In some arrangements, a portion of a lateral surface of the via portion 31*v* is exposed by the seed layer structure 310. In some arrangements, the dielectric layer 60 includes a portion (also referred to as "a first portion") that contacts a portion of a lateral surface of one of the wires of the wire bundle portion 31*w*. In some arrangements, the dielectric layer 60 further includes another portion (also referred to as "a second portion") that is free from contacting the one of the wires. The second portion of the dielectric layer 60 may be spaced apart from the wires. A point in the second portion of the dielectric layer 60 may be closer to the via portion 31*v* than a point in the first portion of the dielectric layer 60. The second portion of the dielectric layer 60 may be exposed to the void v1. In arrangements, an end or a portion (e.g., the end portion having the surface 311*a*) of the seed layer 311 is exposed to the void v1. In some arrangements, an end or a portion (e.g., the end portion having the surface 312*a*) of the seed layer 312 is exposed to the void v1. In some arrangements, a portion of a lateral surface of the via portion 31*v* is exposed to the void v1 (or the space). In some arrangements, an end or a portion (e.g., the end portion having the surface 313*a*) of the seed layer 313 is exposed to the void v1. In some arrangements, the dielectric layer 60 further contacts a portion of the wire bundle portion 41*w* and defines a void v2 between the conductive structure 41 and the dielectric layer 60. In arrangements, an end or a portion (e.g., the end portion having the surface 411*a*) of the seed layer 411 is exposed to the void v2. In arrangements, an end or a portion (e.g., the end portion having the surface 412*a*) of the seed layer 412 is exposed to the void v2. In arrangements, an end or a portion (e.g., the end portion having the surface 413*a*) of the seed layer 413 is exposed to the void v2. In some arrangements, the void v1 is spaced apart from the void v2 by a portion of the dielectric layer 60 in a cross-sectional view as shown.

In some arrangements, the dielectric layer 60 further contacts a portion of the wire bundle portion 31*w* and defines a void v3 between the conductive structure 31 and the dielectric layer 60. In arrangements, an end or a portion (e.g., the end portion having the surface 311*a*') of the seed layer 311 is exposed to the void v3. In some arrangements, an end or a portion (e.g., the end portion having the surface 312*a*') of the seed layer 312 is exposed to the void v3. In some arrangements, an end or a portion (e.g., the end portion having the surface 313*a*') of the seed layer 313 is exposed to the void v3. In some arrangements, the dielectric layer 60 further contacts a portion of the wire bundle portion 41*w* and defines a void v4 between the conductive structure 41 and the dielectric layer 60. In arrangements, an end or a portion (e.g., the end portion having the surface 411*a*') of the seed layer 411 is exposed to the void v4. In arrangements, an end or a portion (e.g., the end portion having the surface 412*a*') of the seed layer 412 is exposed to the void v4. In arrangements, an end or a portion (e.g., the end portion having the surface 413*a*') of the seed layer 413 is exposed to the void v4. In some arrangements, the void v3 is spaced apart from the void v4 by a portion of the dielectric layer 60 in a cross-sectional view as shown. In some arrangements, the void v1 and the void v3 are on opposite sides of the conductive structure 31. In some arrangements, the void v2 and the void v4 are on opposite sides of the conductive structure 41. In some examples, the voids v1, v2, v3, and v4 may be filled with air or one or more gases.

In some cases where dielectric layers (e.g., silicon oxide layers) are used as pre-bonding layers in a hybrid bond structure, in order to provide a sufficient Van der Waals interaction between the dielectric layers, the bonding surfaces of the dielectric layers are required to have relatively low surface roughness (e.g., less than 0.5 nm), and thus CMP operations are required to performed on the dielectric layers before being bonded to each other. Moreover, dishing of the conductive pads may occur after the CMP operations and may adversely affect the bonding between the conductive pads. Thus, additional attention is required to reduce the dishing of the conductive pads (e.g., less than about 3 nm). According to some arrangements of the present disclosure, the wire bundle portions are used as pre-bonding layers including wires arranged relative to (e.g., tangled with) each other to provide sufficient bonding strength and fix the relative position of the substrates, the dielectric layers do not serve as pre-bonding layers and thus do not require to have low surface roughness. Therefore, CMP operations can be omitted, manufacturing operations can be simplified, and the cost can be reduced as well.

In addition, according to some arrangements of the present disclosure, the dielectric layer 60 may include one or more organic dielectric materials having a Tg lower than about 180° C., and the organic materials from opposite substrates 10 and 20 may soften and expand upon heating to connect to each other so as to bond the substrates 10 and 20. While the softened organic materials may render an alignment shift between the substrate 10 and 20, the wires are used as pre-bonding layers and tangled each other to provide sufficient bonding strength and fix the relative position of the substrates 10 and 20 to prevent shifts in relative positions. Therefore, by bonding the substrates 10 and 20 with the dielectric layer 60 and the wires, in addition to omitting CMP operations, simplifying the manufacturing process, and reducing the cost, the shift in the relative position of the substrates 10 and 20 in the manufacturing process can be further reduced or prevented. Therefore, the manufacturing yield can be improved.

Figure 2A:
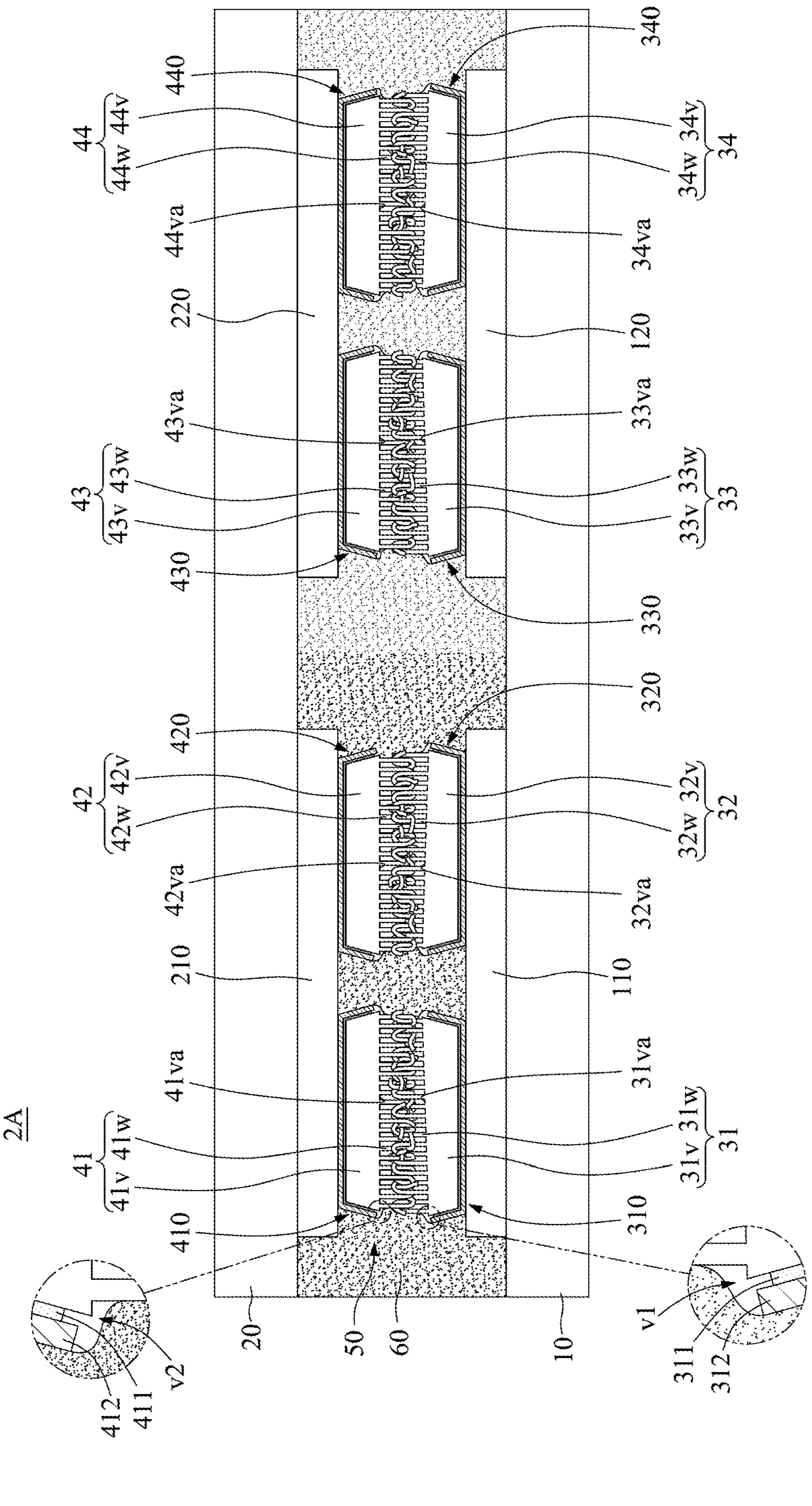
FIG. 2A is a cross-section of a package structure in accordance with some arrangements of the present disclosure.

FIG. 2A is a cross-section of a package structure 2A in accordance with some arrangements of the present disclosure. The structure illustrated in FIG. 2A is similar to that in FIG. 1A, and the differences therebetween are described as follows.

In some arrangements, the seed layer structure 310 of the package structure 2A includes seed layers 311 and 312. In some arrangements, the thickness of the seed layer 312 is greater than the thickness of the seed layer 311. In some arrangements, the seed layer structure 310 does not include a third seed layer (e.g., the seed layer 313 illustrated in FIG. 1A). In some arrangements, the seed layer structure 410 of the package structure 2A includes seed layers 411 and 412. In some arrangements, the thickness of the seed layer 412 is greater than the thickness of the seed layer 411. In some arrangements, the seed layer structure 410 does not include a third seed layer (e.g., the seed layer 413 illustrated in FIG. 1A).

In some arrangements, the seed layer structures 320, 330, and 340 have structures similar to that of the seed layer structure 310, the seed layer structures 420, 430, and 440 have structures similar to that of the seed layer structure 410, and the descriptions thereof are omitted hereinafter.

In some arrangements, the via portion 41*v* has a substantially constant thickness, and the surface 41*va* of the via portion 41*v* is inclined with respect to the surface 31*va* of the via portion 31*v*. For example, the distances between the top and bottom surfaces of the via portion 41*v* measured along vertical axes that are perpendicular to a reference surface remains constant along the top and bottom surfaces of the via portion 41*v*, where the reference surface is a surface such as the top and bottom surfaces of the via portion 41*v*, a surface of the conductive layer 110 that contacts the seed layer structure 310, or a surface of the seed layer structure 310 that contacts the conductive layer 110. For example, the distances between the surfaces 41*va* and 31*va* measured along vertical axes that are perpendicular to the reference surface changes along the surfaces 41*va* and 31*va*. Similarly, in some arrangements, the via portion 42*v* has a substantially constant thickness, and the surface 42*va* of the via portion 42*v* is inclined with respect to the surface 32*va* of the via portion 32*v*. Similarly, in some arrangements, the via portion 43*v* has a substantially constant thickness, and the surface 43*va* of the via portion 43*v* is inclined with respect to the surface 33*va* of the via portion 33*v*. Similarly, in some arrangements, the via portion 44*v* has a substantially constant thickness, and the surface 44*va* of the via portion 44*v* is inclined with respect to the surface 34*va* of the via portion 34*v*.

Figure 2B:
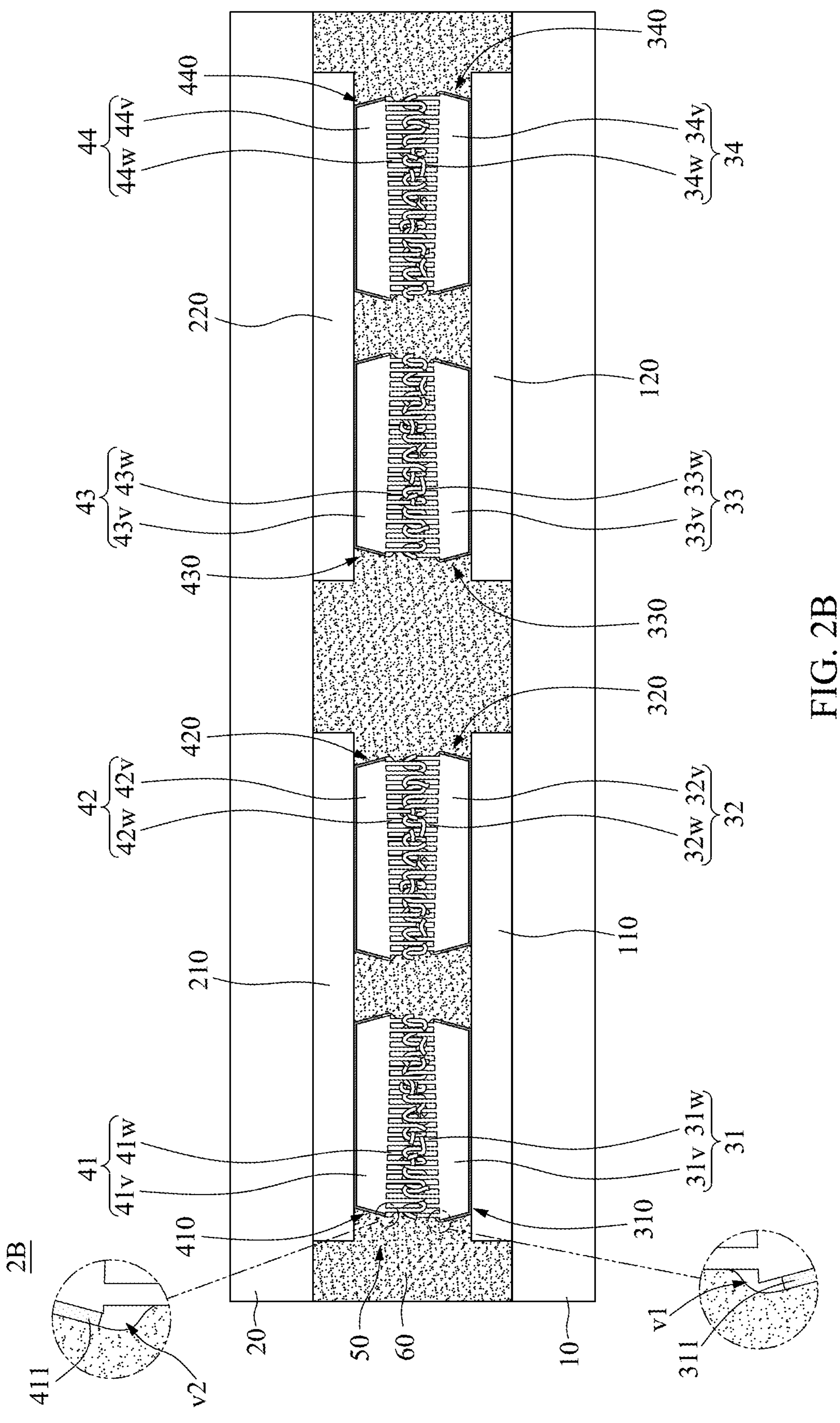
FIG. 2B is a cross-section of a package structure in accordance with some arrangements of the present disclosure.

FIG. 2B is a cross-section of a package structure 2B in accordance with some arrangements of the present disclosure. The structure illustrated in FIG. 2B is similar to that in FIG. 1A, and the differences therebetween are described as follows.

In some arrangements, the seed layer structure 310 of the package structure 2B includes a single seed layer 311. In some arrangements, the thickness of the seed layer 311 is equal to or greater than about 2000 Å. In some arrangements, the seed layer structure 310 does not include a second seed layer and third seed layer (e.g., the seed layers 312 and 313 illustrated in FIG. 1A). In some arrangements, the seed layer structure 410 of the package structure 2B includes a single seed layer 411. In some arrangements, the thickness of the seed layer 411 is equal to or greater than about 2000 Å. In some arrangements, the seed layer structure 410 does not include a second seed layer and third seed layer (e.g., the seed layers 412 and 413 illustrated in FIG. 1A).

In some arrangements, the seed layer structures 320, 330, and 340 have structures similar to that of the seed layer structure 310, the seed layer structures 420, 430, and 440 have structures similar to that of the seed layer structure 410, and the descriptions thereof are omitted hereinafter.

Figure 2C:
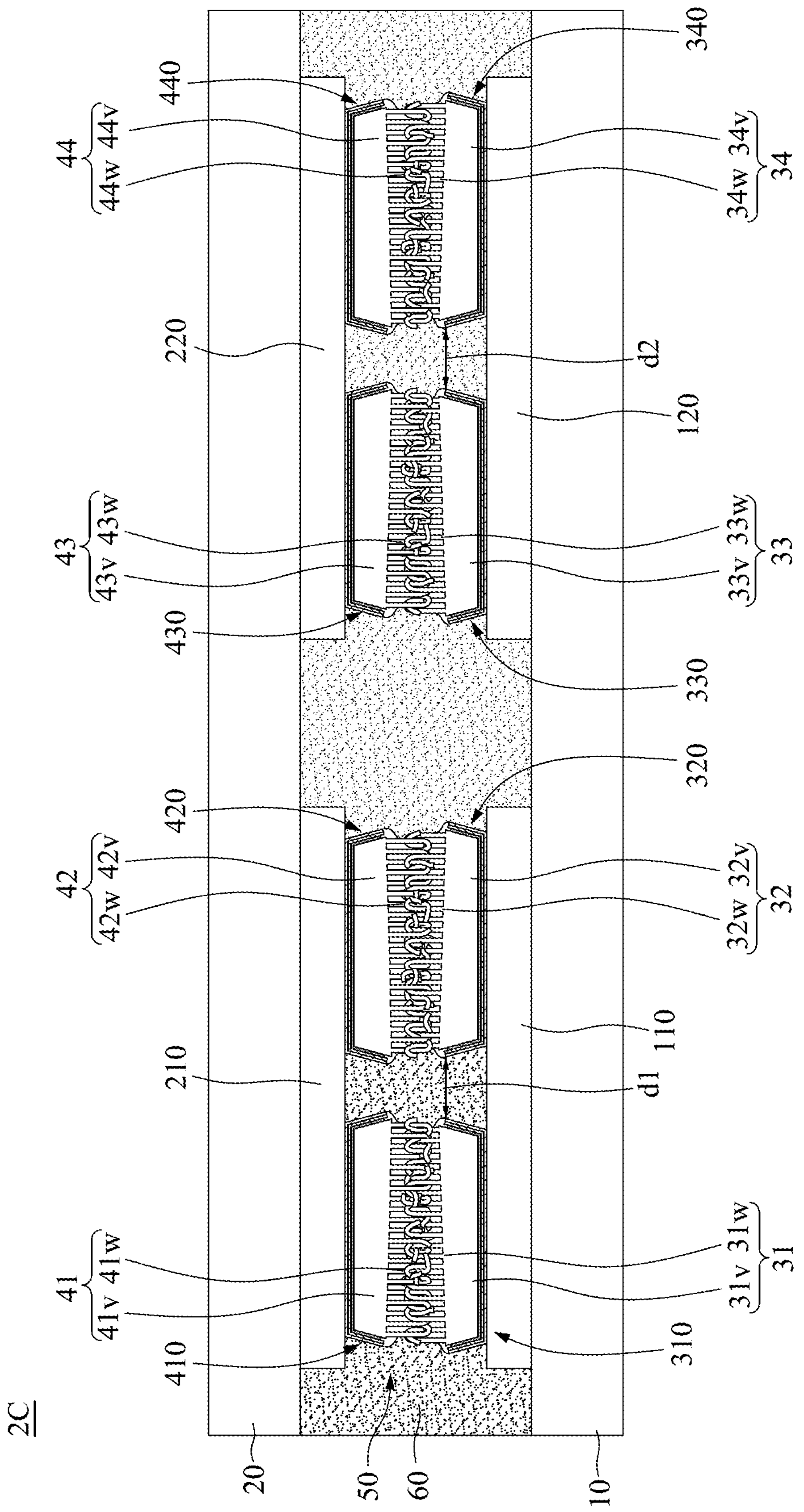
FIG. 2C is a cross-section of a package structure in accordance with some arrangements of the present disclosure.

FIG. 2C is a cross-section of a package structure 2C in accordance with some arrangements of the present disclosure. The structure illustrated in FIG. 2C is similar to that in FIG. 1A, except that the distance d1 between the conductive structure 31 and the conductive structure 32 is substantially the same as the distance d2 between the conductive structure 33 and the conductive structure 34.

Figure 2D:
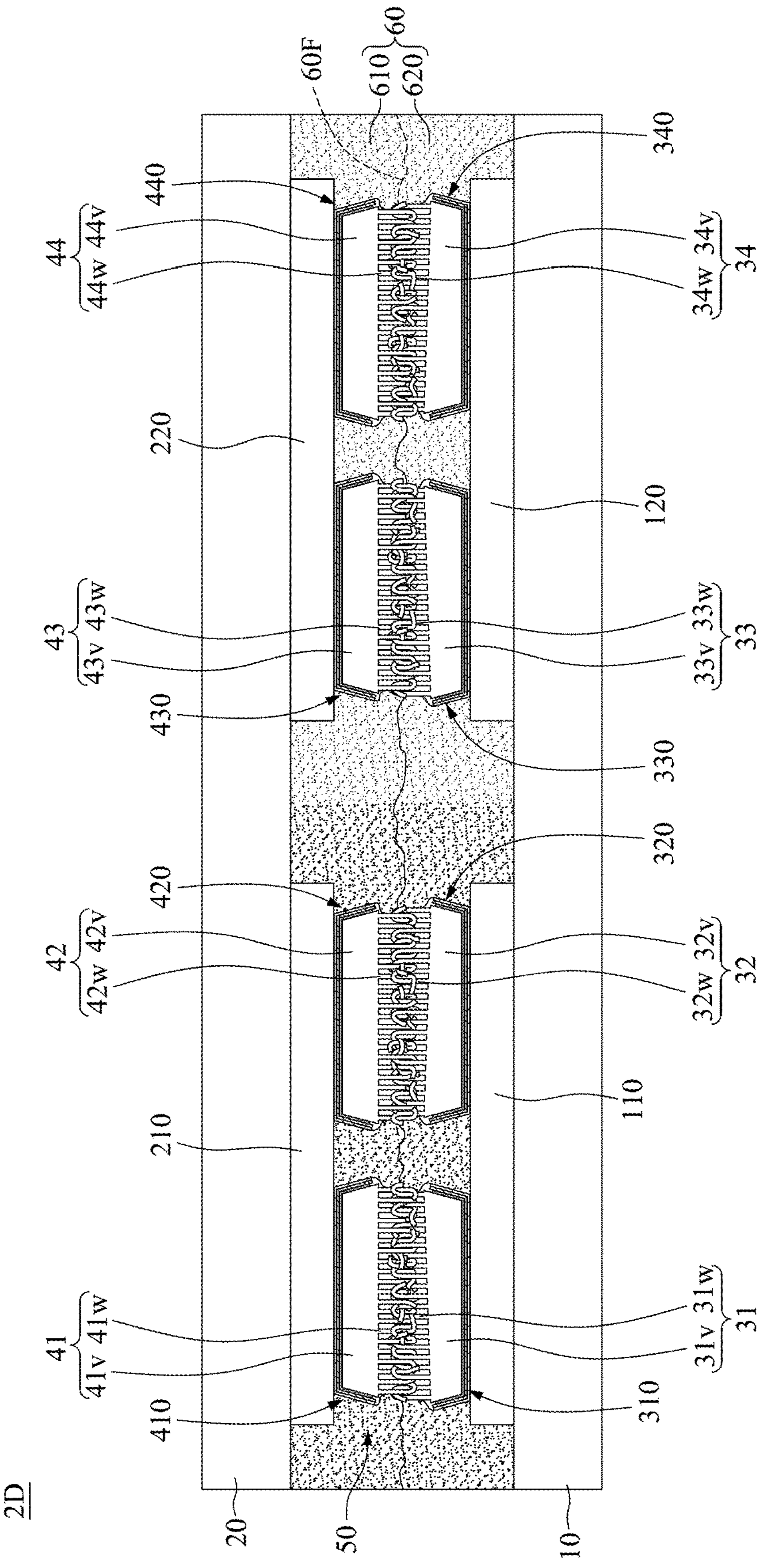
FIG. 2D is a cross-section of a package structure in accordance with some arrangements of the present disclosure.

FIG. 2D is a cross-section of a package structure 2D in accordance with some arrangements of the present disclosure. The structure illustrated in FIG. 2D is similar to that in FIG. 1A, and the differences therebetween are described as follows.

In some arrangements, the dielectric layer 60 includes a portion 610 encapsulating the conductive structures 41, 42, 43, and 44 and a portion 620 encapsulating the conductive structures 31, 32, 33, and 34, and an interface 60F between the portion 610 and the portion 620. In some examples, the interface 60F includes an irregular surface adjacent to the conductive structures 31, 32, 33, 34, 41, 42, 43, and 44. In some arrangements, the interface 60F includes a plurality of portions having different elevations relative to one or more horizontal surfaces as described herein. In some arrangements, the portion 620 (also referred to as "a first dielectric layer") laterally covers the wires of the wire bundle portions 31*w*, 32*w*, 33*w*, and 34*w*. In some arrangements, the portion 610 further laterally covers the wires of the wire bundle portions 41*w*, 42*w*, 43*w*, and 44*w*. In some arrangements, the portion 610 (also referred to as "a second dielectric layer") laterally encapsulates a portion of the conductive structures 41, 42, 43, and 44.

Figure 3A:
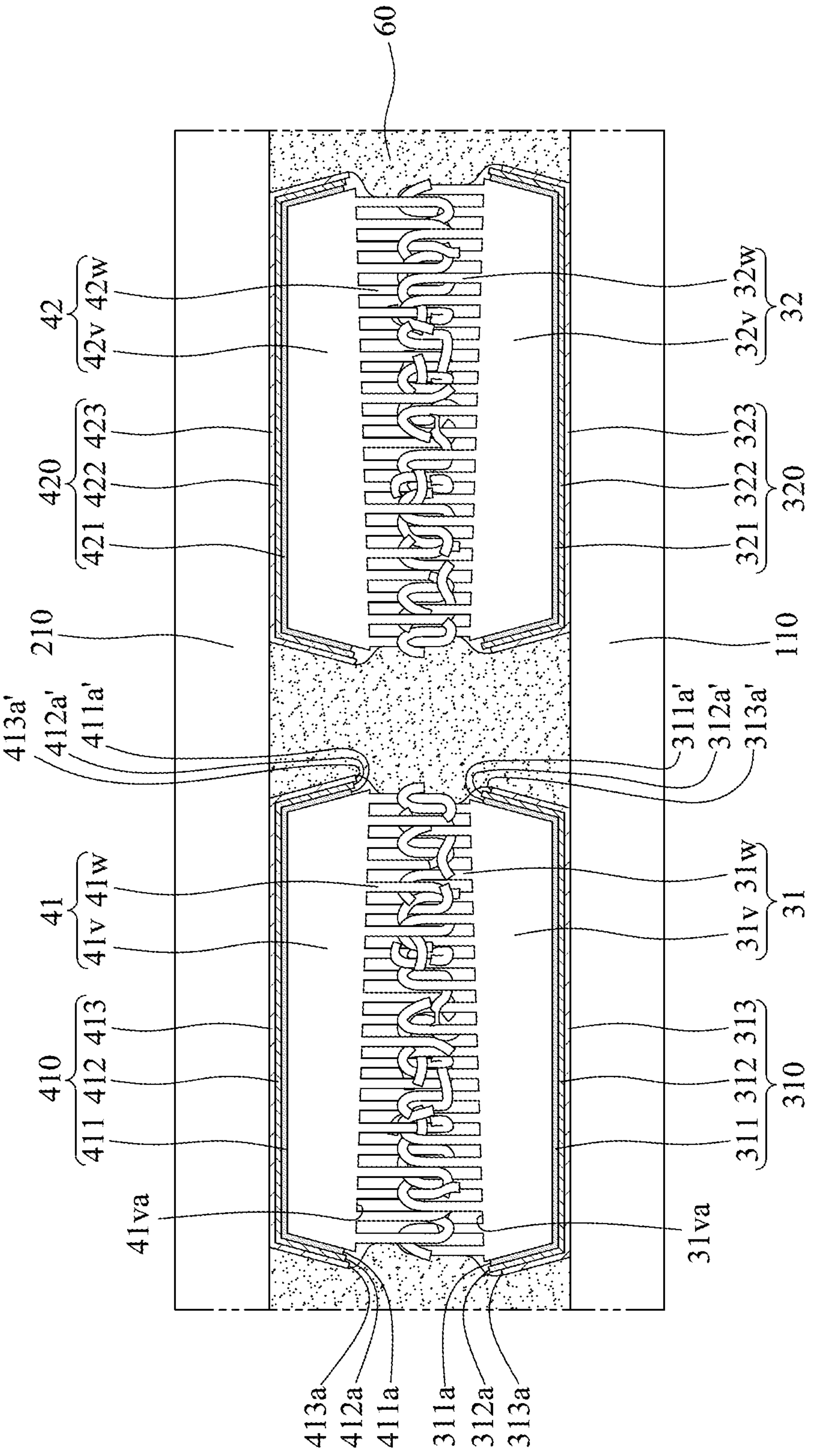
FIG. 3A is a cross-section of a portion of a package structure in accordance with some arrangements of the present disclosure.

FIG. 3A is a cross-section of a portion of a package structure in accordance with some arrangements of the present disclosure. In some arrangements, FIG. 3A is a cross-section of a portion of the package structure 1 illustrated in FIG. 1A.

In some arrangements, the surface 311*a* is recessed from the surface 312*a* along direction or axis that is perpendicular to a reference surface (e.g., the surface 31*vb*, a surface of the conductive layer 110 that contacts the seed layer structure 310, or a surface of the seed layer structure 310 that contacts the conductive layer 110), and the surface 311*a*' is recessed from the surface 312*a*' along direction or axis that is perpendicular to the reference surface. In some arrangements, the surface 313*a* is recessed from the surfaces 311*a* and 312*a* along direction or axis that is perpendicular to the reference surface, and the surface 313*a*' is recessed from the surfaces 311*a*' and 312*a*' along direction or axis that is perpendicular to the reference surface. In some arrangements, the surface 411*a* is recessed from the surfaces 412*a* and 413*a* along direction or axis that is perpendicular to a reference surface (e.g., the surface 41*vb*, a surface of the conductive layer 210 that contacts the seed layer structure 410, or a surface of the seed layer structure 410 that contacts the conductive layer 210), and the surface 411*a* is recessed from the surfaces 412*a*' and 413*a*' along direction or axis that is perpendicular to the reference surface. In some arrangements, the surface 412*a* is recessed from the surface 413*a* along direction or axis that is perpendicular to the reference surface, and the surface 412*a*' is recessed from the surface 413*a*' along direction or axis that is perpendicular to the reference surface.

One or more of the seed layer structures of the package structure 1 illustrated in FIGS. 1A-1C may be modified to include other features described herein, including the structure of the seed layer structure 310 and/or the structure of the seed layer structure 410 illustrated in FIG. 3A to generate additional arrangements of the present disclosure.

Figure 3B:
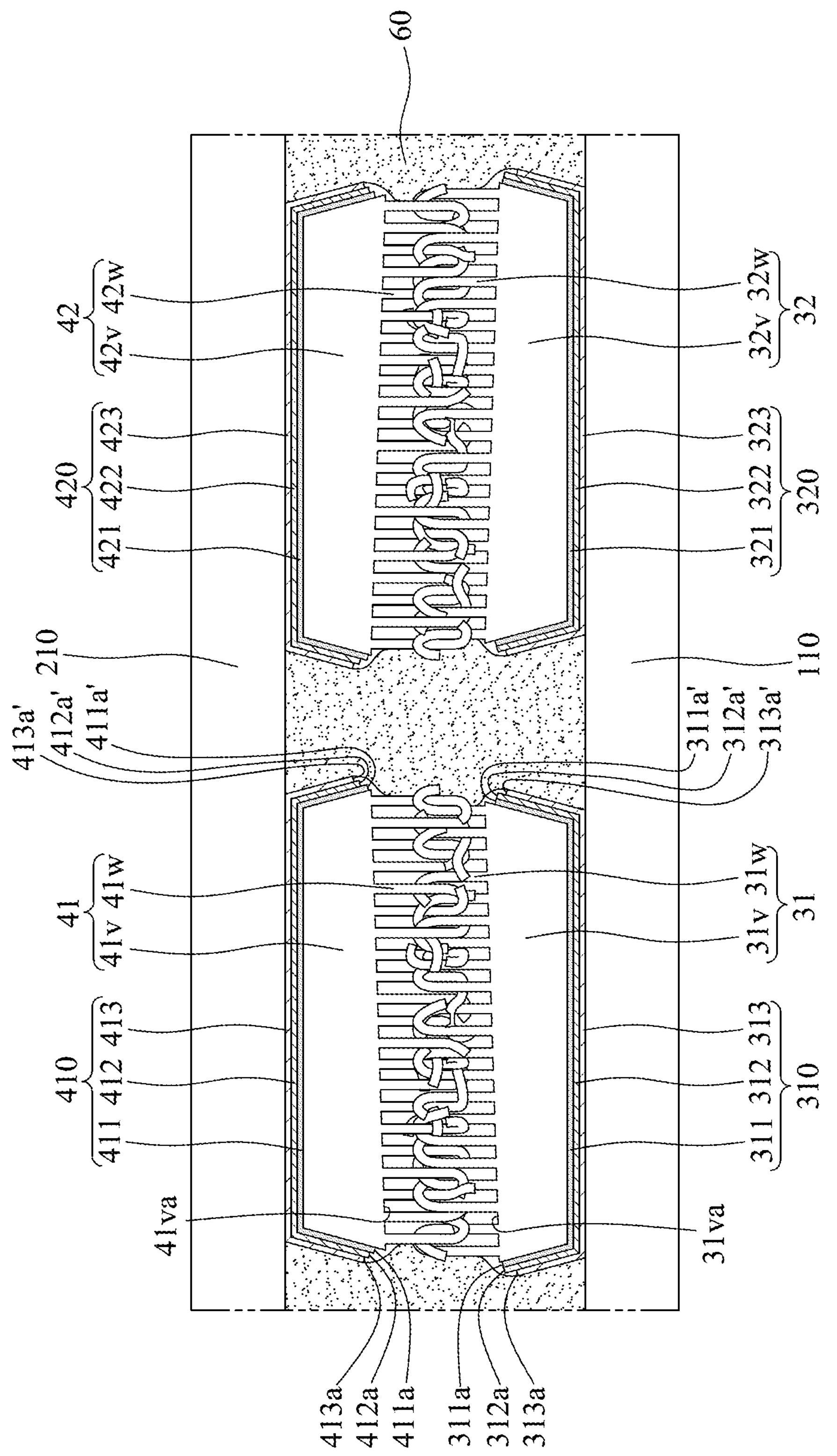
FIG. 3B is a cross-section of a portion of a package structure in accordance with some arrangements of the present disclosure.

FIG. 3B is a cross-section of a portion of a package structure in accordance with some arrangements of the present disclosure. In some arrangements, FIG. 3B is a cross-section of a portion of the package structure 1 illustrated in FIG. 1A.

In some arrangements, the surface 313*a* is recessed from the surfaces 311*a* and 312*a* along direction or axis that is perpendicular to a reference surface (e.g., the surface 31*vb*, a surface of the conductive layer 110 that contacts the seed layer structure 310, or a surface of the seed layer structure 310 that contacts the conductive layer 110), and the surface 313*a*' is recessed from the surfaces 311*a*' and 312*a*' along direction or axis that is perpendicular to the reference surface. In some arrangements, the surface 311*a* is substantially aligned or coplanar with respect to the surface 312*a*, and the surface 311*a*' is substantially aligned or coplanar with respect to the surface 312*a*'. In some arrangements, the surface 413*a* is recessed from the surfaces 411*a* and 412*a* along direction or axis that is perpendicular to a reference surface (e.g., the surface 41*vb*, a surface of the conductive layer 210 that contacts the seed layer structure 410, or a surface of the seed layer structure 410 that contacts the conductive layer 210), and the surface 413*a*' is recessed from the surfaces 411*a*' and 412*a*' along a direction or axis that is perpendicular to the reference surface. In some arrangements, the surface 412*a* is recessed from the surface 411*a*, and the surface 412*a*' is recessed with respect to the surface 411*a*' along a direction or axis that is perpendicular to the reference surface.

One or more of the seed layer structures of the package structure 1 illustrated in FIGS. 1A-1C may be modified to include other features described herein, including the structure of the seed layer structure 310 and/or the structure of the seed layer structure 410 illustrated in FIG. 3B to generate additional arrangements of the present disclosure.

FIG. 4A, FIG. 4B, FIG. 4C, FIG. 4D, FIG. 4E, FIG. 4F, FIG. 4G, FIG. 4H, FIG. 4I, FIG. 4J, and FIG. 4K illustrate various stages of an example of a method for manufacturing a package structure 2C in accordance with some arrangements of the present disclosure.

Figure 4A:
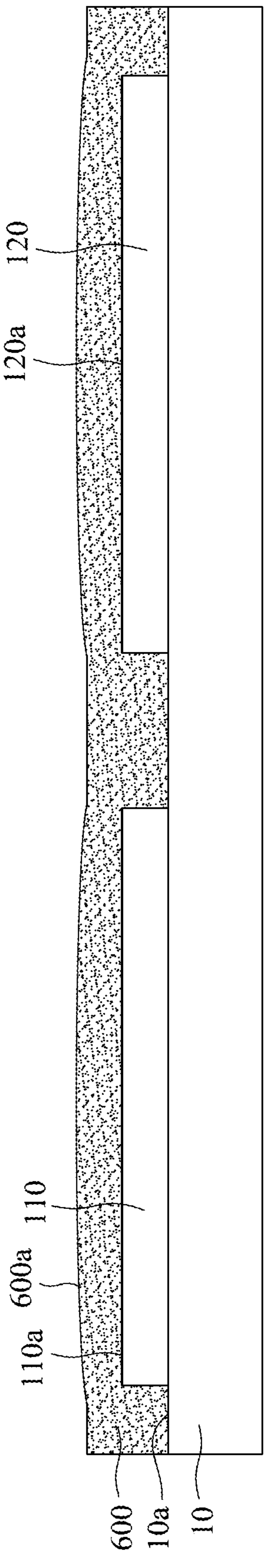
FIG. 4A, FIG. 4B, FIG. 4C, FIG. 4D, FIG. 4E, FIG. 4F, FIG. 4G, FIG. 4H, FIG. 4I, FIG. 4J, and FIG. 4K illustrate various stages of an example of a method for manufacturing a package structure in accordance with some arrangements of the present disclosure.

Referring to FIG. 4A, a substrate 10 including conductive layers 110 and 120 may be provided, and a dielectric material layer 600 may be formed over the substrate 10. In some arrangements, the conductive layers 110 and 120 may be formed on a surface 10*a* of the substrate 10. The conductive layers 110 and 120 may be formed by sputtering. In some arrangements, the dielectric material layer 600 may be conformally formed on surfaces 110*a* and 120*a* of the conductive layers 110 and 120 and the surface 10*a* of the substrate 10 to form a non-planar top surface 600*a* of the dielectric material layer 600. The dielectric material layer 600 may be formed by coating.

Figure 4B:
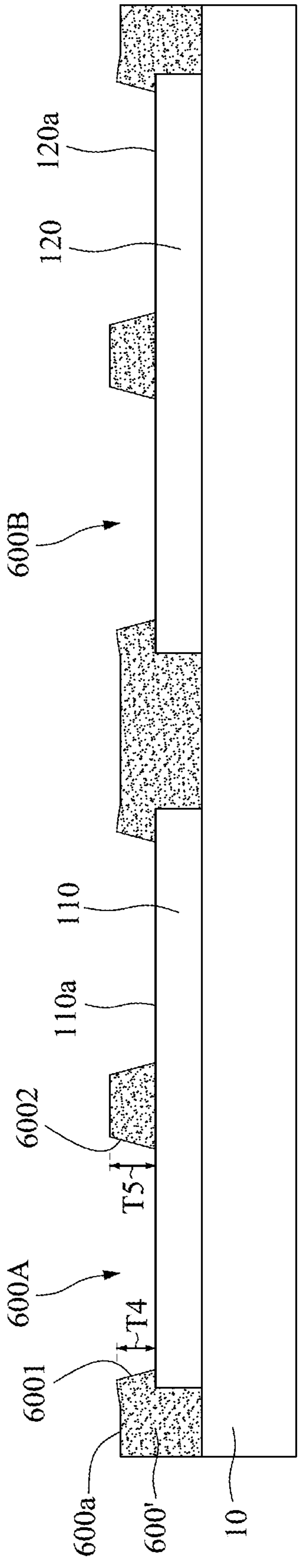

Referring to FIG. 4B, portions of the dielectric material layer 600 may be removed to form openings 600A and 600B in the dielectric material layer 600', and the openings 600A and 600B may expose the conductive layers 110 and 120, respectively. In some arrangements, the openings 600A and 600B are formed in the dielectric material layer 600' without performing any planarization operation (e.g., a chemical mechanical polishing operation) on the top surface 600*a* of the dielectric material layer 600. In some arrangements, the opening 600A has a depth increasing from a sidewall 6001 toward a sidewall 6002. In some arrangements, the opening 600A has a depth T4 adjacent to the sidewall 6001 and a depth T5 adjacent to the sidewall 6002.

Figure 4C:
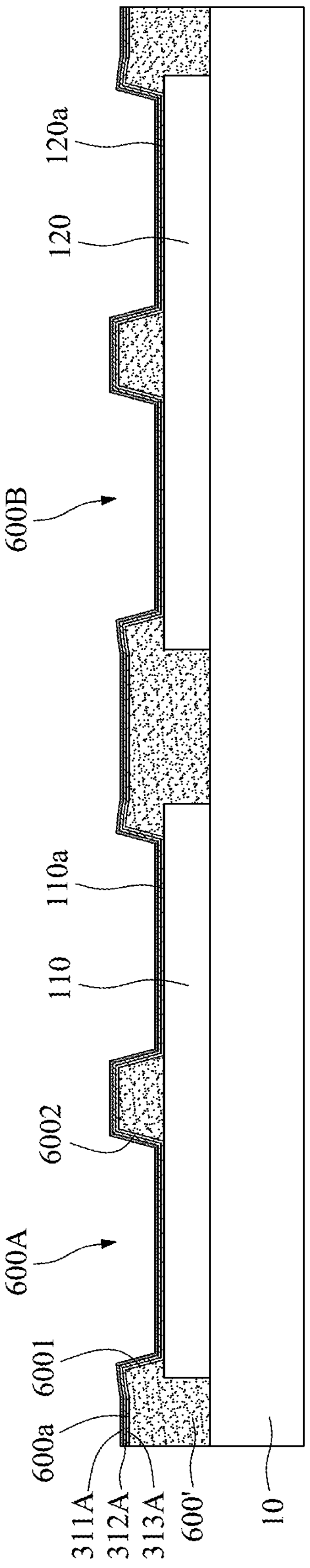

Referring to FIG. 4C, a seed layer structure may be formed on the top surface 600*a* of the dielectric material layer 600' and in the openings 600A and 600B. In some arrangements, the seed layer structure is conformally formed on the top surface 600*a*, sidewalls of the openings 600A and 600B, and the exposed surfaces 110*a* and 120*a*. The seed layer structure may include seed layers 311A, 312A, and 313A. The seed layers 311A, 312A, and 313A may be formed by sputtering.

Figure 4D:
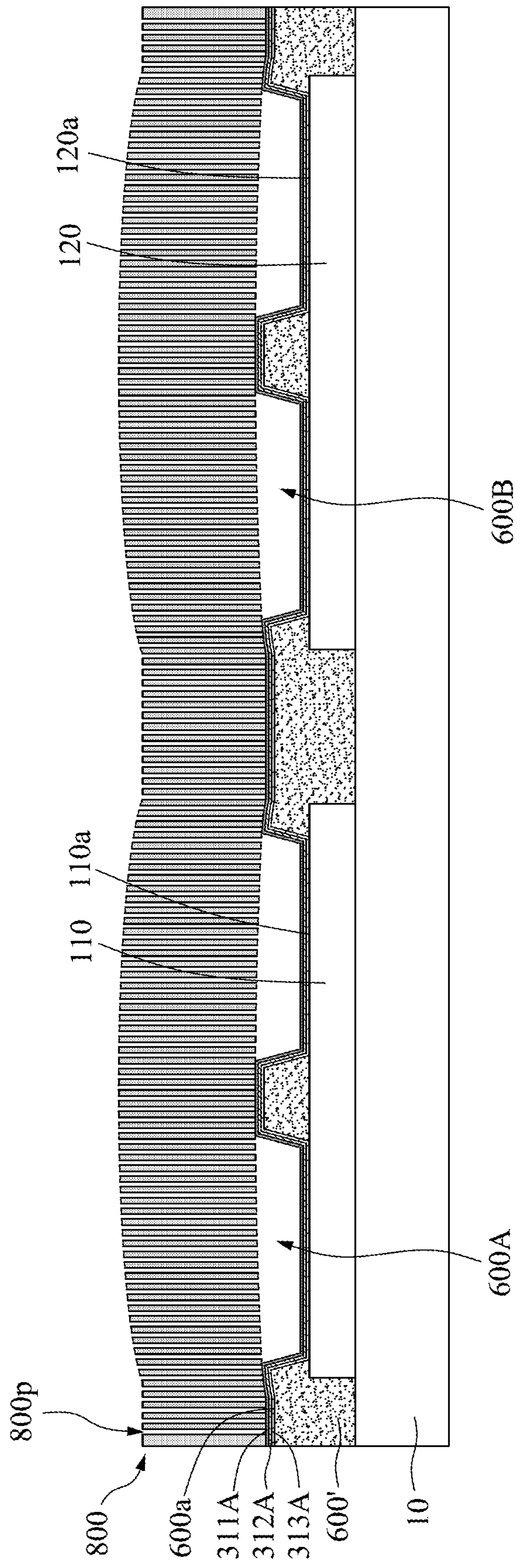

Referring to FIG. 4D, a template 800 including a plurality of pores 800*p* may be disposed over the surface 600*a* and the openings 600A and 600B of the dielectric material layer 600'. In some arrangements, the pores 800*p* are nanopores within the template 800 extending from one side to the other side of the template 800. In some arrangements, the pores 800*p* penetrate the template 800. In some arrangements, some of the pores 800*p* connect to the openings 600A and 600B, and some of the pores 800*p* expose portions of the seed layer 311A over the surface 600*a*.

Figure 4E:
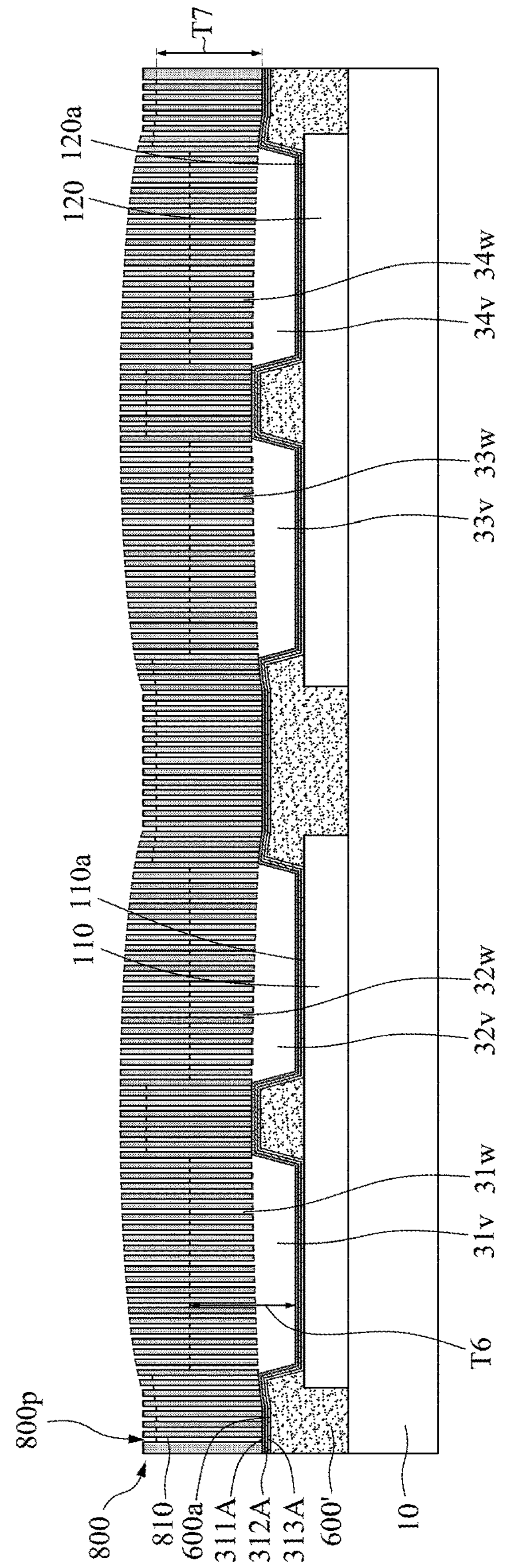

Referring to FIG. 4E, wires may be formed in the pores of the template 800, and via portions (or vias) may be formed in the openings 600A and 600B. The wires may include wire 810 over the surface 600*a* and wires which construct wire bundle portions 31*w*-34*w* over the openings 600A and 600B. In some arrangements, the wires and the via portions are formed by a same operation. In some arrangements, a plating operation or a deposition operation may be performed to form the wires and the via portions. In some arrangements, a thickness T7 of the wires 810 may be substantially equal to a total thickness T6 of a thickness of the via portions (e.g., the via portions 31*v*, 32*v*, 33*v*, and 34*v*)

and a thickness of the wires of the wire bundle portion (e.g., the wire bundle portions 31*w*, 32*w*, 33*w*, and 34*w*). In some arrangements, the thickness of the wires of the wire bundle portion is equal to or less than about 200 nm. In some arrangements, the wires 810 are directly formed on portions of the seed layer 311A that are exposed to the pores of the template 800. In some arrangements, the via portions 31*v*, 32*v*, 33*v*, and 34*v* are directly formed on the seed layer 311A within the openings 600A and 600B, and the wires of the wire bundle portions 31*w*, 32*w*, 33*w*, and 34*w* are integrally formed with the via portions 31*v*, 32*v*, 33*v*, and 34*v*.

Figure 4F:
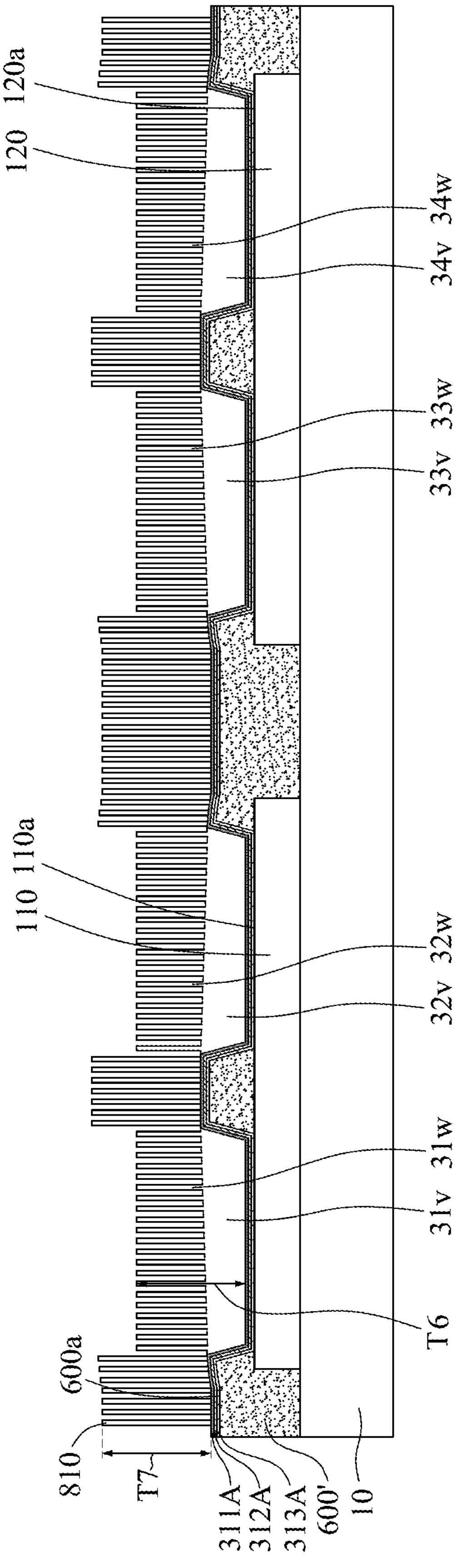

Referring to FIG. 4F, the template 800 may be removed.

Figure 4G:
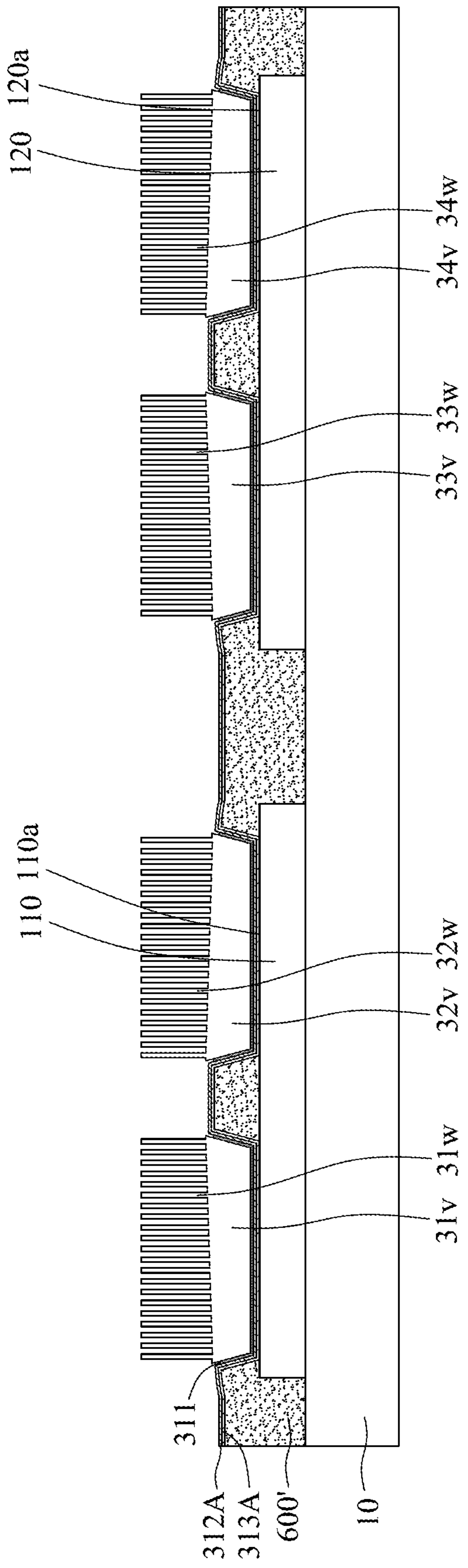

Referring to FIG. 4G, portions (also referred to as "first portions") of the seed layer 311A exposed by the via portions 31*v*, 32*v*, 33*v*, and 34*v* may be removed to form a seed layer 311. In some arrangements, the wires 810 on the portions of the seed layer 311A are removed along with the removed portions of the seed layer 311A. The portions of the seed layer 311A may be removed by a wet etching operation. The etching solution may have a relatively high etching selectivity to the seed layer 311A relative to the seed layer 312A and the wires. In some arrangements, the etching selectivity of the seed layer 311A to the seed layer 312A and the wires is greater than about 2, 3, 5, 8, or 10. According to some arrangements of the present disclosure, the seed layer 311A includes first portions at an elevation substantially the same as that of the via portions 31*v*, 32*v*, 33*v*, and 34*v* and exposed to the etching solution, and the seed layer 311A further includes second portions that are embedded in the dielectric material layer 600' and at least partially below the via portions 31*v*, 32*v*, 33*v*, and 34*v*. The first portions of the seed layer 311A are immediately exposed to the etching solution, and thus the first portions of the seed layer 311A and the wires 810 formed thereon may be removed by the wet etching operation. On the other hand, the second portions of the seed layer 311A are below the first portions of the seed layer 311A as well as the via portions 31*v*, 32*v*, 33*v*, and 34*v*. Therefore the second portions of the seed layer 311A are protected by the embedded structure, and thus the second portions of the seed layer 311A as well as the via portions 31*v*, 32*v*, 33*v*, and 34*v* formed thereon can be prevented from being removed in the wet etching operation.

Figure 4H:
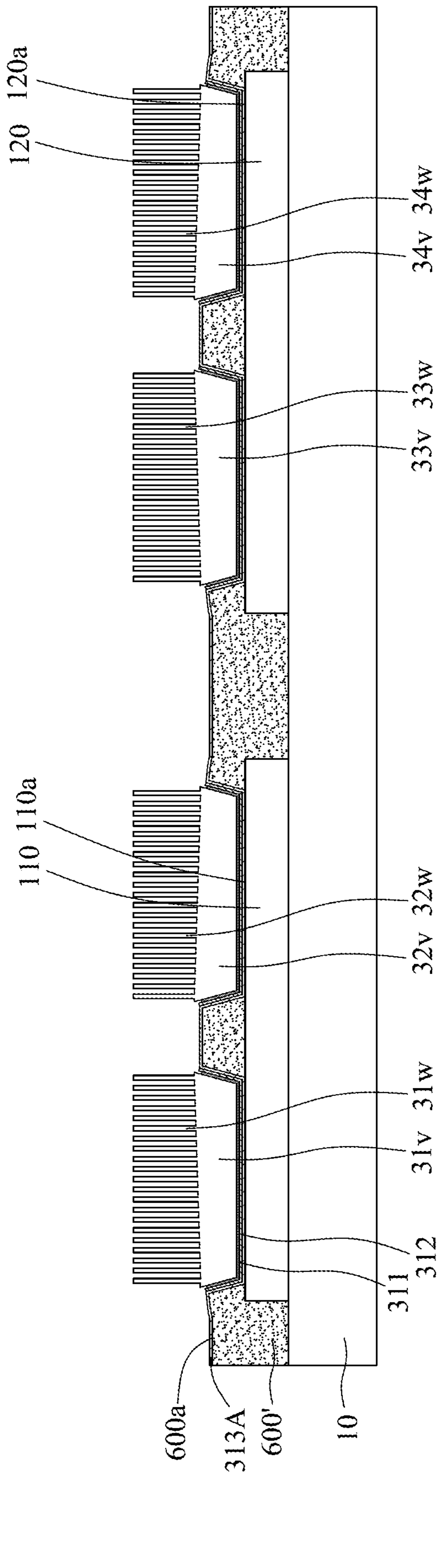

Referring to FIG. 4H, portions of the seed layer 312A exposed by the via portions 31*v*, 32*v*, 33*v*, and 34*v* may be removed to form a seed layer 312. The portions of the seed layer 312A may be removed by a wet etching operation. The etching solution may have a relatively high etching selectivity to the seed layer 312A relative to the seed layer 313A. In some arrangements, the etching selectivity of the seed layer 312A to the seed layer 313A is greater than about 2, 3, 5, 8, or 10. In some arrangements, a ratio of the thickness of the seed layer 312A to the thickness of the wires of the wire bundle portions is equal to or greater than about 10. According to some arrangements of the present disclosure, with the above design of the thicknesses of the seed layer 312A and the wires, since the etching time for the relatively thin seed layer 312A is relatively short (e.g., several seconds), the wires having a relatively large thickness may be hardly damaged or only slightly damaged even the etching solution for the seed layer 312A may also etch the wires.

Figure 4I:
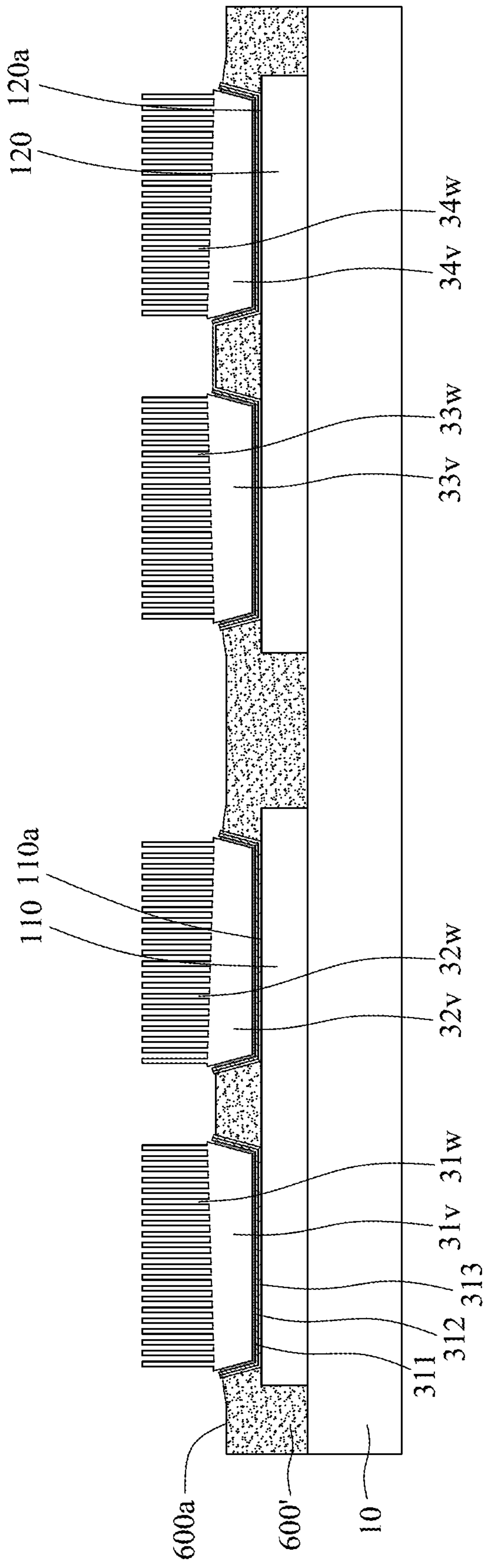

Referring to FIG. 4I, portions of the seed layer 313A exposed by the via portions 31*v*, 32*v*, 33*v*, and 34*v* may be removed to form a seed layer 313. The portions of the seed layer 313A may be removed by a wet etching operation. The etching solution may have a relatively high etching selectivity to the seed layer 313A relative to the wires. In some arrangements, the etching selectivity of the seed layer 313A to the wires is greater than about 2, 3, 5, 8, or 10. As such, the via portions 31*v*, 32*v*, 33*v*, and 34*v* and the wire bundle portions 31*w*, 32*w*, 33*w*, and 34*w* collectively serving as a pre-bonding layer are formed on the conductive layers 110 and 120 of the substrate 10.

Figure 4J:
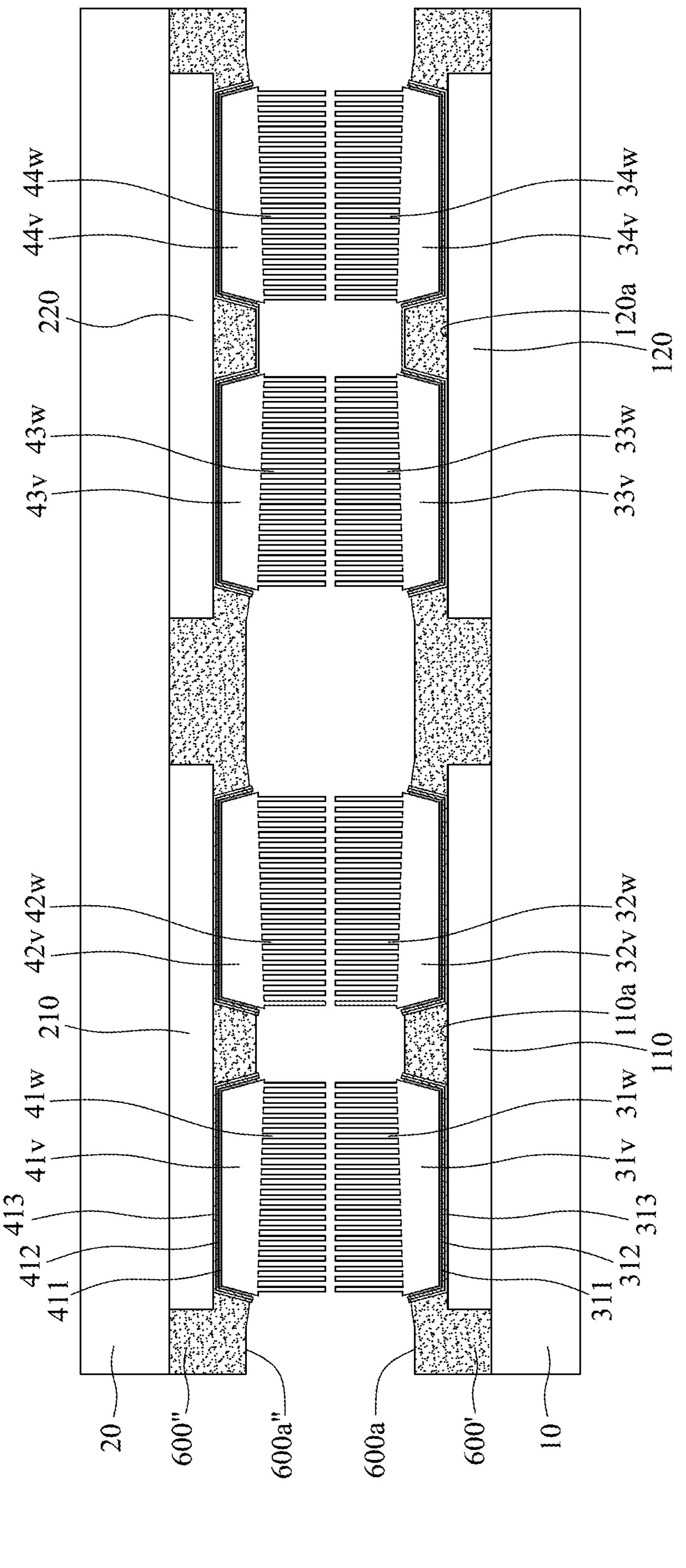

Referring to FIG. 4J, a substrate 20 including conductive layers 210 and 220 may be provided. In some arrangements, operations similar to those illustrated in FIGS. 4A-4I may be performed to form a dielectric material layer 600" having a non-planar surface 600*a*" on the substrate 20. In some arrangements, operations similar to those illustrated in FIGS. 4A-4I may be performed to form via portions 41*v*, 42*v*, 43*v*, and 44*v* and the wire bundle portions 41*w*, 42*w*, 43*w*, and 44*w* collectively serving as a pre-bonding layer on the conductive layers 210 and 220 of the substrate 20. In some arrangements, operations similar to those illustrated in FIGS. 4C-4I may be performed to form seed layers 411, 412, and 413.

Figure 4K:
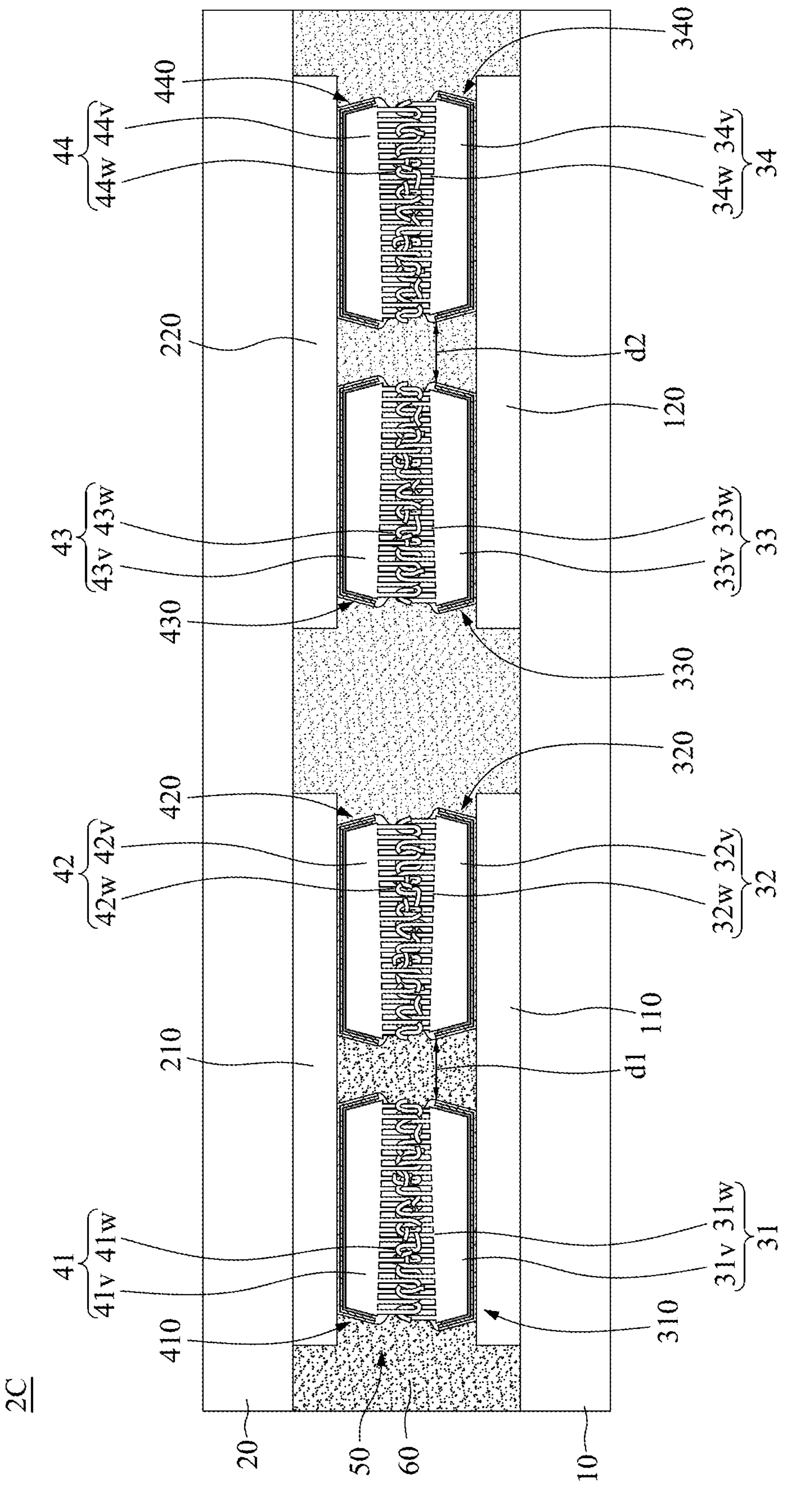

Referring to FIG. 4K, the substrate 20 may be bonded to the substrate 10. In some arrangements, the wire bundle portions 41*w*, 42*w*, 43*w*, and 44*w* (or the pre-bonding layer) may be connected to the wire bundle portions 31*w*, 32*w*, 33*w*, and 34*w* (or the pre-bonding layer). The wires of the wire bundle portions extending from the substrate 10 and the substrate 20 may contact and tangle with each other to fix the relative position of the substrate 10 and the substrate 20 in a vertical direction (e.g., in a direction from the substrate 10 to the substrate 20). As the bonding operation continues, after the wire bundle portions 41*w*, 42*w*, 43*w*, and 44*w* are connected to the wire bundle portions 31*w*, 32*w*, 33*w*, and 34*w*, the dielectric material layers 600' and 600" may soften and expand upon heating, and the surface 600*a* of the dielectric material layer 600 and the surface 600*a*" of the dielectric material layer 600" may approach each other until the dielectric material layers 600' and 600" contact and connect to each other to form a dielectric layer 60. In some arrangements, the heating temperature is greater than a glass transition temperature (Tg) of the dielectric material layers 600' and 600". The dielectric materials layers 600' and 600" may expand to connect to each other as described above due to that the dielectric materials layers and the wire bundle portions have different CTEs. The CTE of the dielectric materials layers 600' and 600" is higher than the CTE of the wire bundle portions. As such, the package structure 2C illustrated in FIG. 2C is formed.

In some arrangements in which a substrate includes a plurality of pads, a seed layer is formed on the entire surface of the substrate and covering the pads, and then nanowires are formed on the seed layer. As such, the nanowires are all electrically connected to each other through the seed layer, such that the pads are all shorted due to the nanowires. To solve such issues, after a seed layer is formed on the pads and the top surface of a dielectric layer of the substrate, a patterned photoresist may be formed on the substrate to partially cover the seed layer. The patterned photoresist includes openings exposing portions of the seed layer that correspond to the pads of the substrate, and then nanowires are formed on the exposed portions of the seed layer to prevent the pads from being shorted. Even with the patterned photoresist and the covered portions of the seed layer being removed afterwards, a layer of conductive material is already formed in the openings of the patterned photoresist and between the nanowires and the top surface of the dielectric layer, which create a gap (or a difference in heights or elevations) between the nanowires and the top surface of the dielectric layer (e.g., a gap of greater than about 6 μm). As such, the dielectric layers from opposing substrates may fail to contact and connect to each other upon heating due to the relatively large distance therebetween resulted from the gap generated by the patterned photoresist.

According to some arrangements of the present disclosure, with the design of the seed layer 311A including a material different from that of the via portion and the wire bundle portion, the seed layer 311A may be formed on the entire surface of the conductive layers 110 and 120 and the top surface 600*a* of the dielectric material layer 600. After the wires are formed over the entire surface of the substrate 10, the wires 810 can be easily removed along with the removal of portions of the seed layer 311A with the wire bundle portions remained on the conductive layers 110 and 120. As such, the separate wire bundle portions are not shorted, the manufacturing process is relatively simplified, and the cost is reduced as well.

In addition, according to some arrangements of the present disclosure, with the thickness of the wires of the wire bundle portion being relatively small (e.g., equal to or less than about 200 nm), the dielectric material layers 600' and 600" may easily approach and contact each other. Thus a hybrid bond structure including the dielectric layer 60 and tangled wires from the wire bundle portions can be formed.

FIG. 5A, FIG. 5B, FIG. 5C, FIG. 5D, FIG. 5E, FIG. 5F, FIG. 5G, FIG. 5H, FIG. 5I, and FIG. 5J illustrate various stages of an example of a method for manufacturing a package structure 5J in accordance with some arrangements of the present disclosure.

Figure 5A:
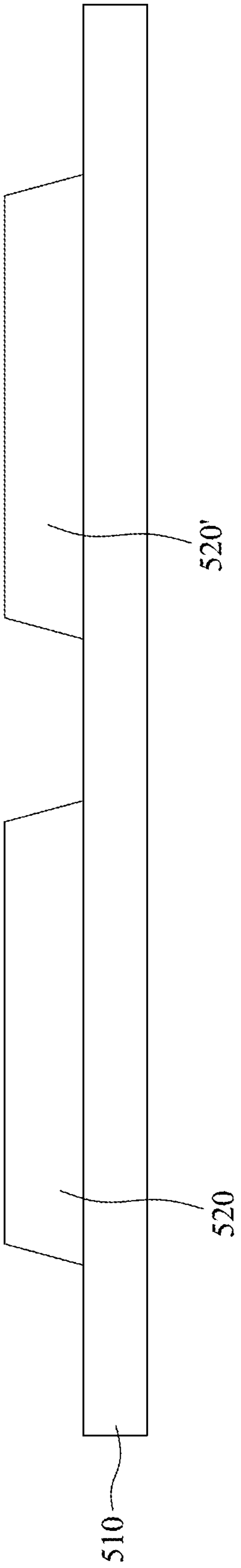
FIG. 5A, FIG. 5B, FIG. 5C, FIG. 5D, FIG. 5E, FIG. 5F, FIG. 5G, FIG. 5H, FIG. 5I, and FIG. 5J illustrate various stages of an example of a method for manufacturing a package structure in accordance with some arrangements of the present disclosure.

Referring to FIG. 5A, a carrier 510 may be provided, and conductive pads 520 and 520' may be formed or disposed on the carrier 510.

Figure 5B:
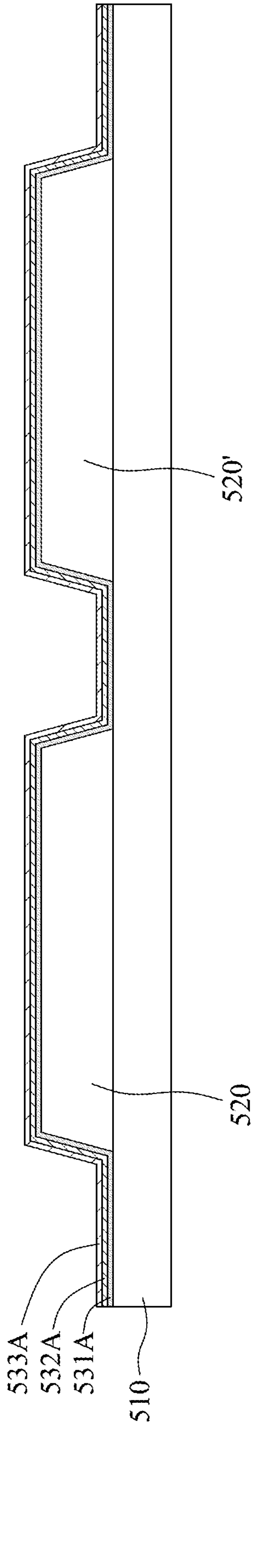

Referring to FIG. 5B, seed layers 531A, 532A, and 533A may be formed on the carrier 510 and the conductive pads 520 and 520'. The materials and the operations for forming the seed layers 531A, 532A, and 533A may be the same as or similar to those of the seed layers 311A, 312A, and 313A as described above, and the description thereof is omitted hereinafter.

Figure 5C:
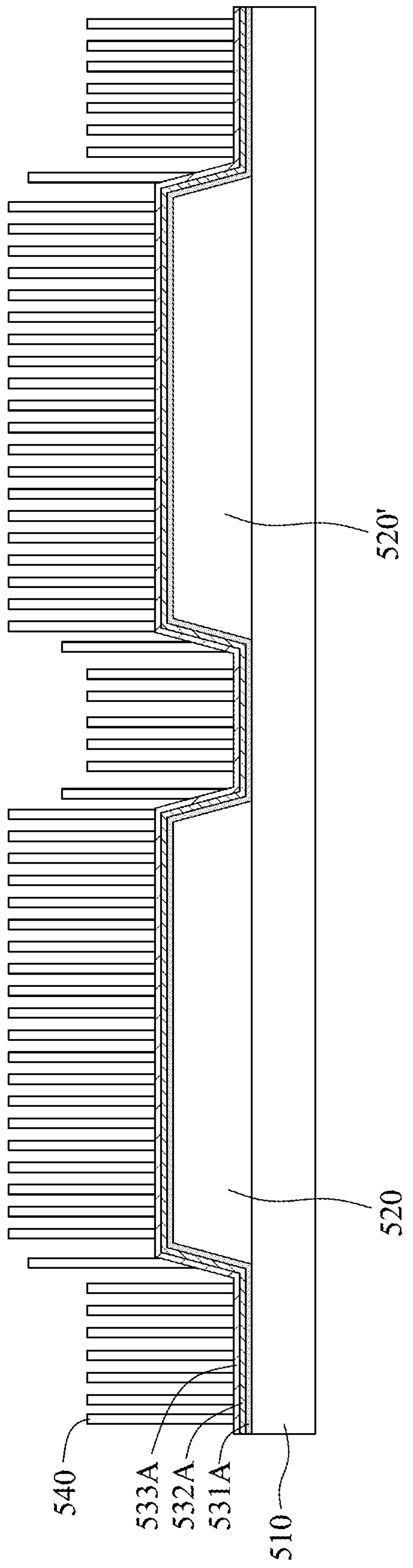

Referring to FIG. 5C, wires 540 may be formed on the seed layer 531A. The material and the operations for forming the wires 540 may be the same as or similar to those of the wires 810 and wires of the wire bundle portions 31*w* and 41*w* as described above, and the description thereof is omitted hereinafter.

Figure 5D:
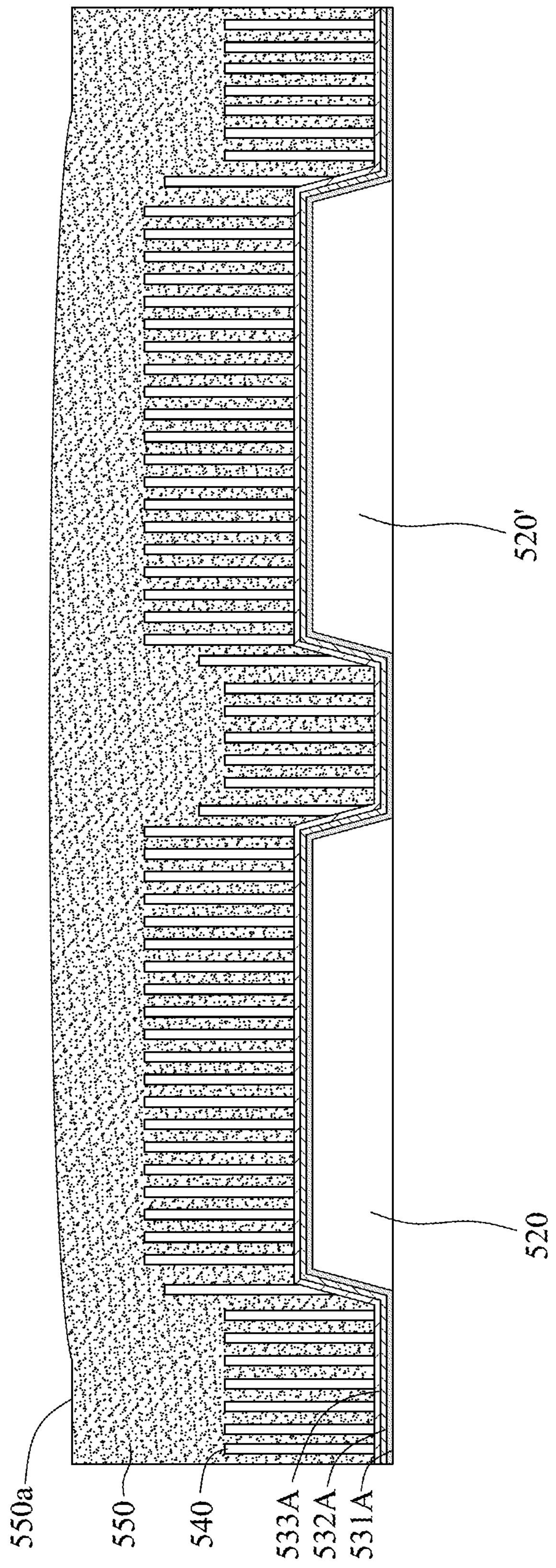

Referring to FIG. 5D, a dielectric material layer 550 may be formed over the wires 540. The dielectric material layer 550 may have a non-planar top surface 550*a*. The material and the operations for forming the dielectric material layer 550 may be the same as or similar to those of the dielectric material layer 600 as described above, and the description thereof is omitted hereinafter.

Figure 5E:
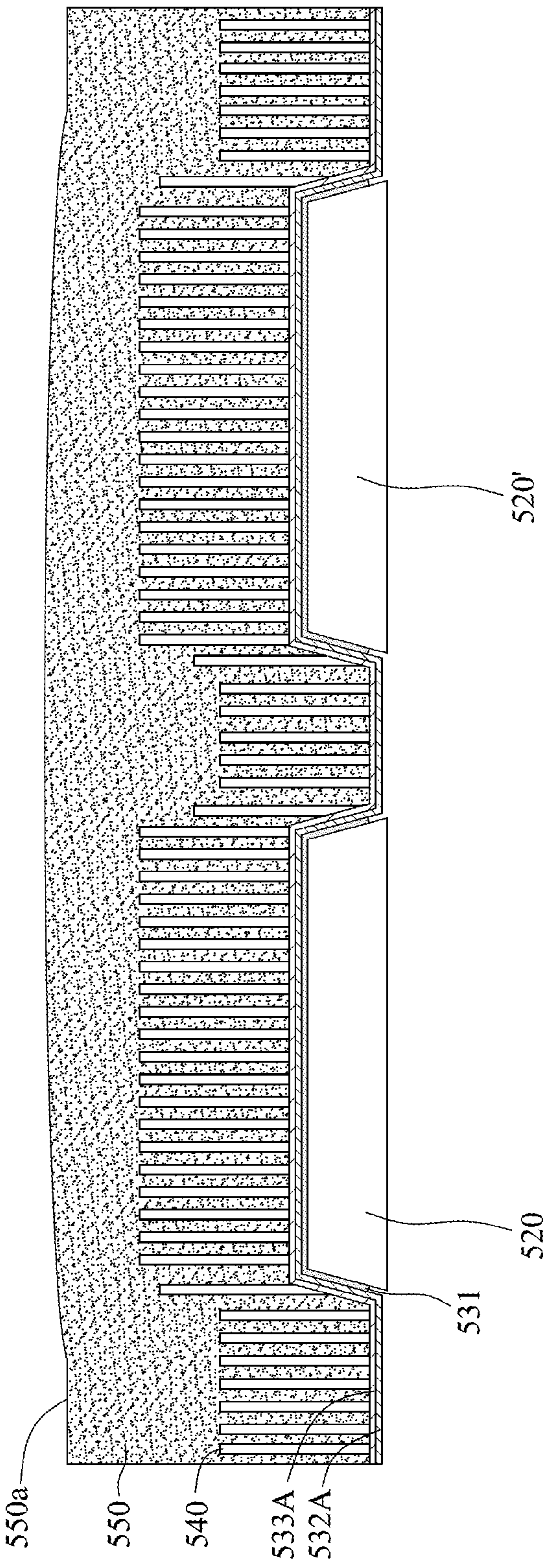

Referring to FIG. 5E, the carrier 510 may be removed, and portions of the seed layer 531A exposed by the conductive pads 520 and 520' may be removed to form a seed layer 531. The operations for forming the seed layer 531 may be the same as or similar to those of the seed layer 311 as described above, and the description thereof is omitted hereinafter.

Figure 5F:
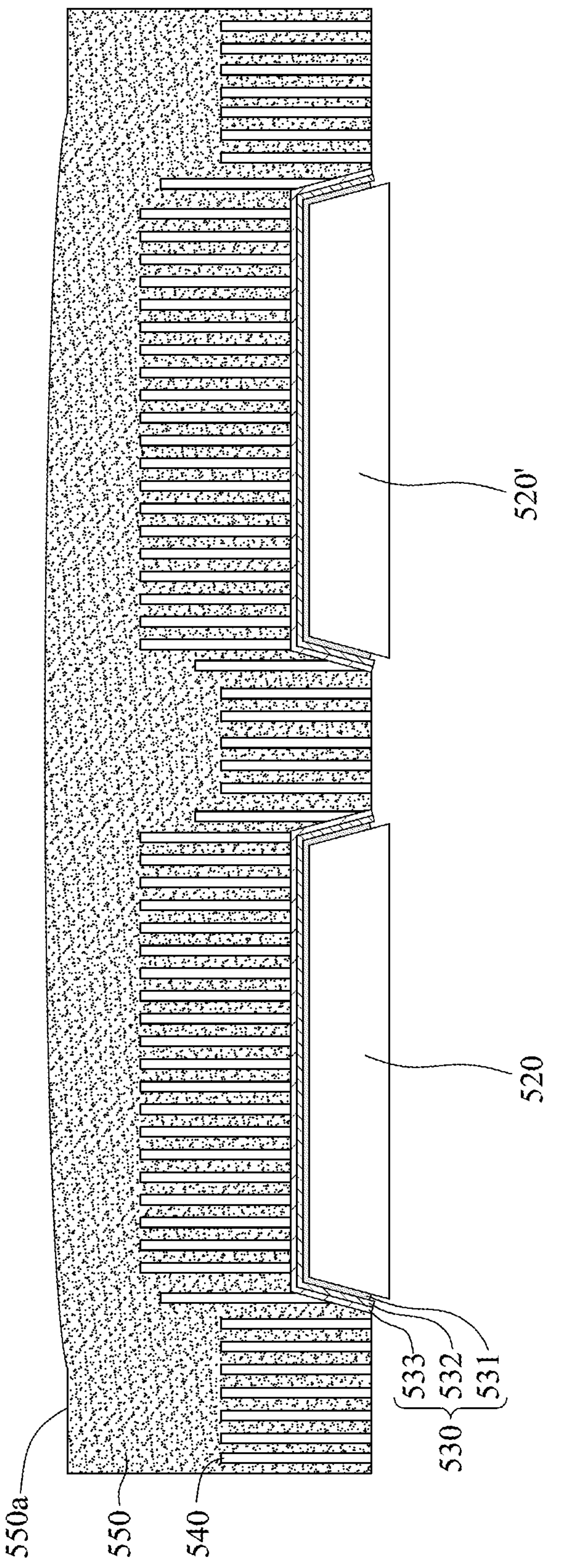

Referring to FIG. 5F, portions of the seed layer 532A exposed by the conductive pads 520 and 520' may be removed to form a seed layer 532, and portions of the seed layer 533A exposed by the conductive pads 520 and 520' may be removed to form a seed layer 533. The operations for forming the seed layers 532 and 533 may be the same as or similar to those of the seed layers 312 and 313 as described above, and the description thereof is omitted hereinafter.

Figure 5G:
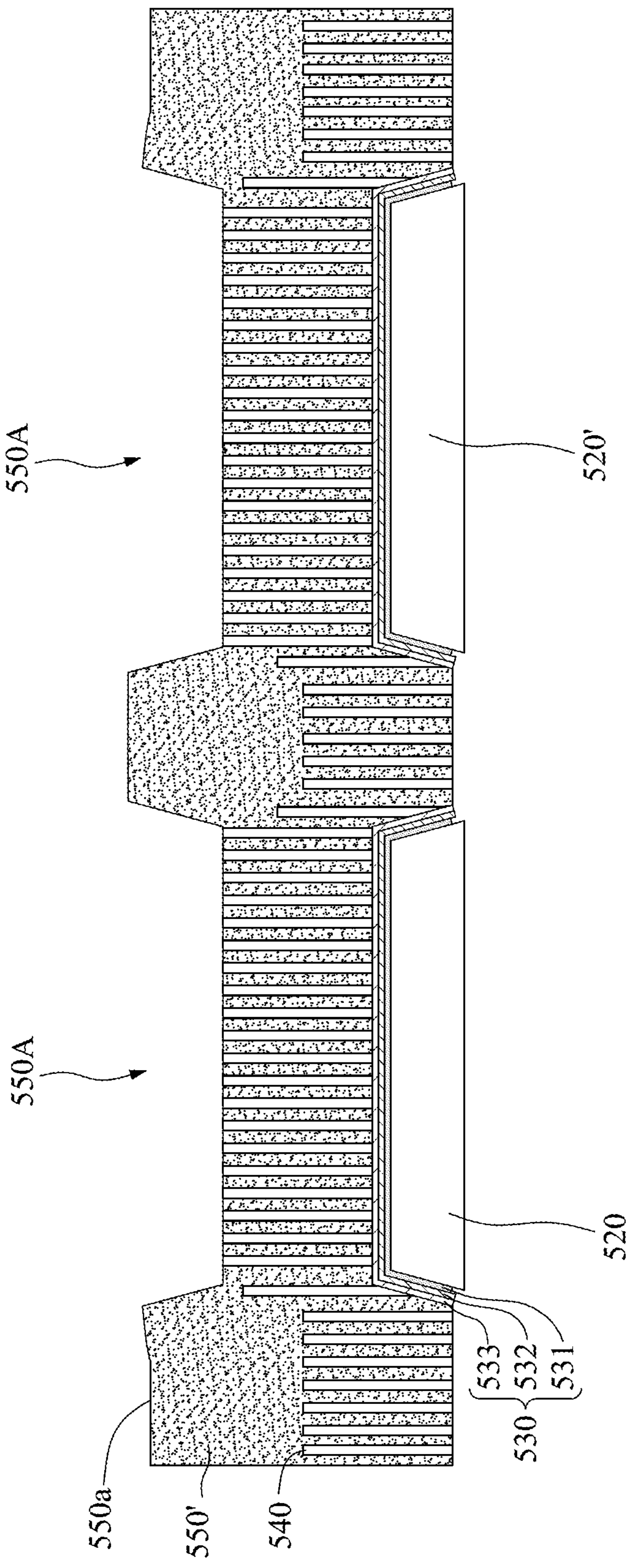

Referring to FIG. 5G, portions of the dielectric material layer 550 may be removed to form openings 550A in the dielectric material layer 550', and the openings 550A may expose the conductive pads 520 and 520'.

Figure 5H:
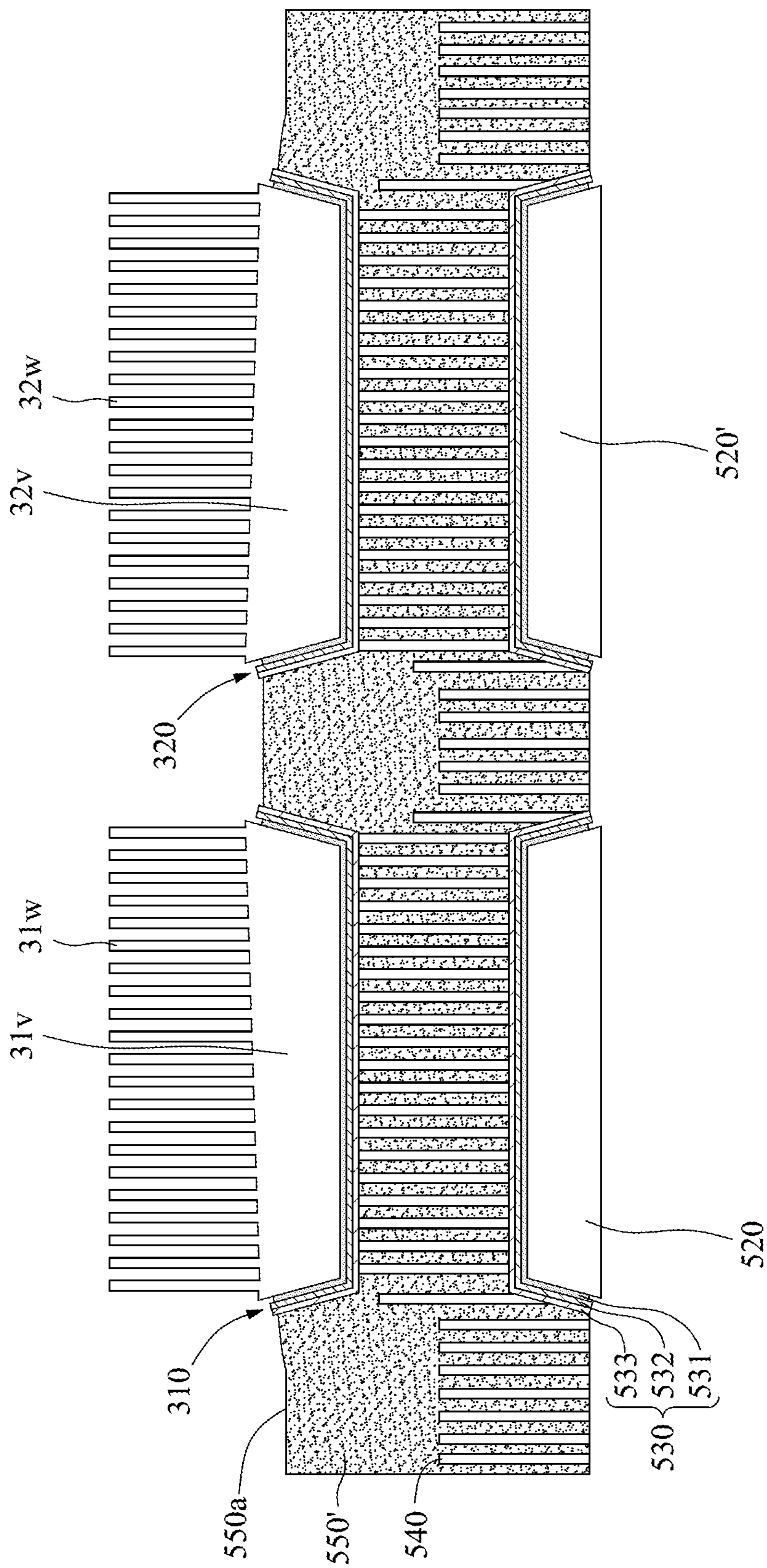

Referring to FIG. 5H, operations similar to those illustrated in FIGS. 4C-4I may be performed to form the seed layer structures 310 and 320, the via portions 31*v* and 32*v*, and the wire bundle portions 31*w* and 32*w*.

Figure 5I:
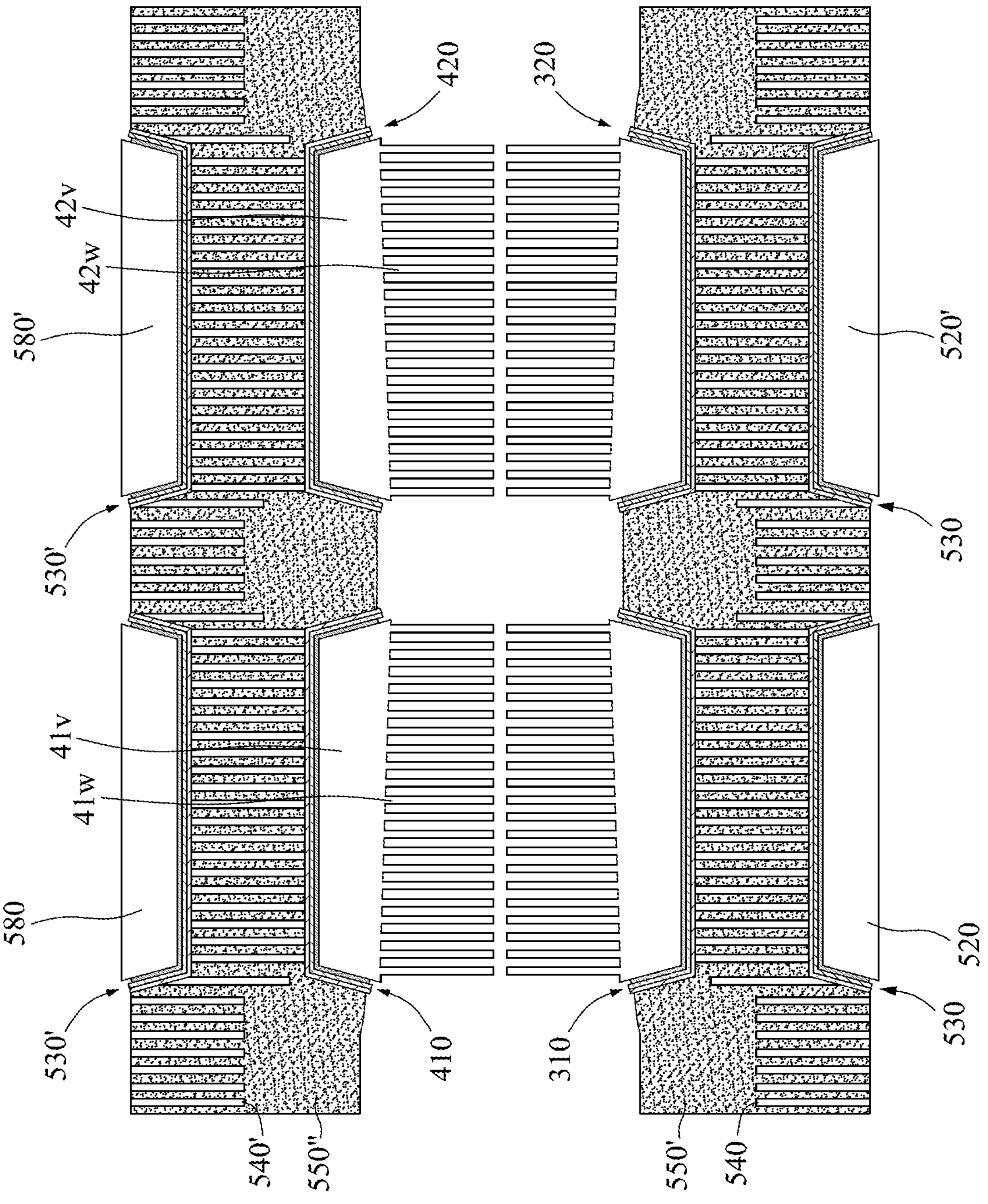

Referring to FIG. 5I, a structure including conductive pads 580 and 580', seed layers 530', wires 540', a dielectric material layer 550', seed layer structures 410 and 420, via portions 41*v* and 42*v*, and the wire bundle portions 41*w* and 42*w* may be formed by operations similar to those illustrated in FIGS. 5A-5H.

Figure 5J:
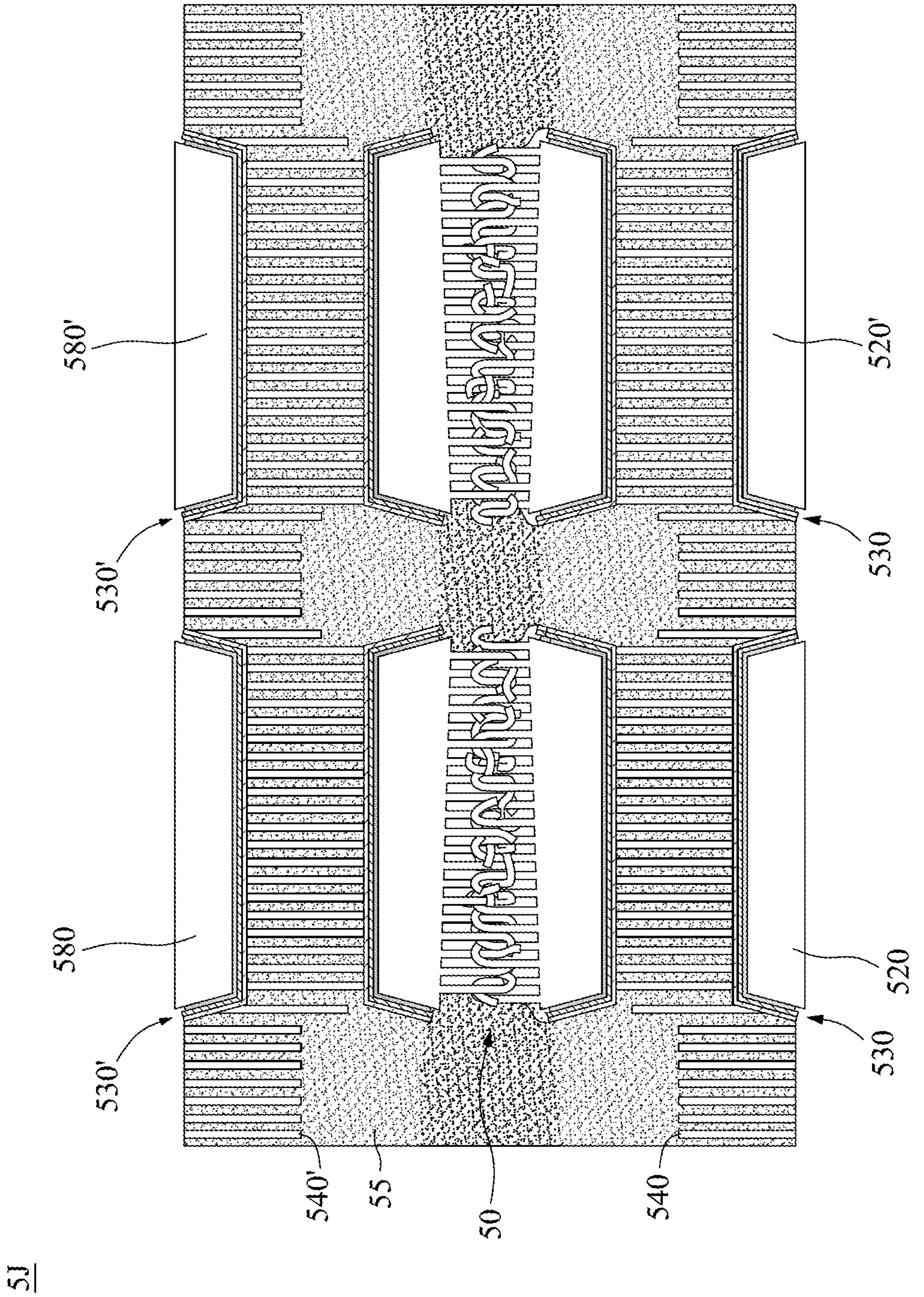

Referring to FIG. 5J, the structures illustrated in FIG. 5I may be bonded to each other by operations similar to those illustrated in FIG. 4K. As the bonding operation continues, after the wire bundle portions 41*w* and 42*w* are connected to the wire bundle portions 31*w* and 32*w*, the dielectric material layers 550' and 550" may soften and expand upon heating, and the surface of the dielectric material layer 550' and the surface of the dielectric material layer 550" may approach to each other until the dielectric material layers 550' and 550" contact and connect to each other to form a dielectric layer 55. As such, a package structure 5J is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that such practical implementations do not deviate from this disclosure.

As used herein, the terms "approximately," "substantially," "substantial," and "about" are used to describe and account for small variations. When used in conjunction with a design, a structure, an event, or circumstance, these terms can refer to instances in which the design, structure, event, or circumstance occurs precisely as well as instances in which the design, structure, event, or circumstance occurs to a close approximation. For example, when used in conjunction with a numerical value, these terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to #1°, less than or equal to ±0.5°, less than or equal to ±0.1°, or less than or equal to ±0.05°.

Two surfaces can be deemed to be coplanar or substantially coplanar if these surfaces are parallel or substantially parallel, and a displacement between the two surfaces is no greater than 5 μm, no greater than 2 μm, no greater than 1 μm, or no greater than 0.5 μm. A surface can be deemed to be substantially flat if a displacement between a highest point of the surface relative to a reference surface and a lowest point of the surface relative to the reference surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive," and "electrical conductivity" refer to an ability to transport or transfer an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The term "layer" as used herein refers to a portion of material comprising a region having a certain thickness. A layer may extend across the entire underlying or superstructure, or may have an extent that is less than the entire extent of the underlying or superstructure. In addition, a layer may be a region of a homogeneous or heterogeneous continuous structure, the thickness of which is less than that of the continuous structure. For example, a layer may be located between the top and bottom surfaces of the continuous structure or between any pair of horizontal planes therebetween. Layers may extend horizontally, vertically and/or along the tapered surface. A substrate can be one layer, can include one or more layers therein, and/or can have one or more layers thereon, above, and/or below. A layer can include multiple layers. For example, a semiconductor layer may comprise one or more doped or undoped semiconductor layers, and may be of the same or different materials.

As used herein, an "elevation" of an element relative to a reference surface refers to a distance of a point of the element (e.g., a surface, volume, line, edge, and so on) to the reference surface along a direction or axis that is perpendicular to the reference surface, in either a top-to-bottom direction or a bottom-to-top direction as shown in the FIGS. In some examples, the point of the element corresponds to the shortest distance between the element and the reference surface along any direction or axis that is perpendicular to the reference surface.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A bond structure, comprising:

a first conductive structure comprising a first via portion and a plurality of first wires extending from the first via portion;

a second conductive structure over the first conductive structure and electrically connected to the first conductive structure via the first wires;

a dielectric layer laterally covering the first wires and comprising a first portion contacting a portion of a lateral surface of one of the first wires; and a plurality of seed layers disposed between the dielectric layer and the first via portion, wherein the seed layers comprises a first seed layer, a second seed layer, and a third seed layer, and the second seed layer is between the first seed layer and the third seed layer, and wherein the material of the third seed layer is different from that of the first seed layer and the second seed layer, and wherein the first seed layer comprises a first end portion, the second seed layer comprises a second end portion, and the third seed layer comprises a third end portion recessed from the first end portion and the second end portion with respect to a bottom surface of the first via portion.

2. The bond structure in claim 1, wherein the second conductive structure comprises a plurality of second wires electrically connected to the plurality of first wires, and the dielectric layer laterally covers the plurality of second wires.

3. The bond structure in claim 2, wherein the dielectric layer vertically overlaps a portion of the plurality of first wires or a portion of the plurality of second wires.

4. The bond structure in claim 1, wherein the dielectric layer comprises a second portion spaced apart from the plurality of first wires.

5. The bond structure in claim 4, wherein the second portion of the dielectric layer is closer to the first via portion than the first portion of the dielectric layer is to the first via portion.

6. The bond structure in claim 1, wherein a portion of the first wires in a region over a central area of the first via portion are spaced apart from the dielectric layer.

* * * * *